(12) United States Patent
Chang et al.

(10) Patent No.: US 11,316,030 B2
(45) Date of Patent: Apr. 26, 2022

(54) FIN FIELD-EFFECT TRANSISTOR DEVICE AND METHOD

(71) Applicant: Taiwan Semiconductor Manufacturing Company, Ltd., Hsinchu (TW)

(72) Inventors: Che-Lun Chang, Hsinchu (TW); Shiao-Shin Cheng, Hsinchu (TW); Ji-Yin Tsai, Zhudong Township (TW); Yu-Lin Tsai, Hsinchu (TW); Hsin-Chieh Huang, Hsinchu (TW); Ming-Yuan Wu, Hsinchu (TW); Jiun-Ming Kuo, Taipei (TW); Ming-Jie Huang, Hsinchu (TW); Yu-Wen Wang, New Taipei (TW); Che-Yuan Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/021,640

(22) Filed: Sep. 15, 2020

(65) Prior Publication Data
US 2021/0257479 A1 Aug. 19, 2021

Related U.S. Application Data

(60) Provisional application No. 62/978,756, filed on Feb. 19, 2020.

(51) Int. Cl.
*H01L 29/66* (2006.01)
*H01L 21/02* (2006.01)
(Continued)

(52) U.S. Cl.
CPC .. *H01L 29/66636* (2013.01); *H01L 21/02236* (2013.01); *H01L 21/02532* (2013.01);
(Continued)

(58) Field of Classification Search
CPC ......... H01L 21/02236; H01L 21/02233; H01L 21/0223; H01L 21/02532; H01L 21/823431; H01L 21/823821; H01L 21/845; H01L 27/0886; H01L 27/0924; H01L 27/10879; H01L 27/1211;
(Continued)

(56) References Cited

U.S. PATENT DOCUMENTS 7,902,009 B2* 3/2011 Simonelli ......... H01L 21/02579
438/166
2012/0058616 A1 3/2012 Ahn et al.
(Continued)

FOREIGN PATENT DOCUMENTS

DE 102017126435 A1 2/2019

*Primary Examiner* — David C Spalla
(74) *Attorney, Agent, or Firm* — Slater Matsil, LLP

(57) ABSTRACT

A method includes forming a doped region on a top portion of a substrate, forming a first epitaxial layer over the substrate, forming a recess in the first epitaxial layer, the recess being aligned to the doped region, performing a surface clean treatment in the recess, the surface clean treatment includes: oxidizing surfaces of the recess to form an oxide layer in the recess, and removing the oxide layer from the surfaces of the recess, and forming a second epitaxial layer in the recess.

20 Claims, 43 Drawing Sheets

(51) Int. Cl.
*H01L 29/165* (2006.01)
*H01L 29/08* (2006.01)
*H01L 29/78* (2006.01)

(52) U.S. Cl.
CPC .... *H01L 21/02661* (2013.01); *H01L 29/0847* (2013.01); *H01L 29/165* (2013.01); *H01L 29/66795* (2013.01); *H01L 29/7848* (2013.01); *H01L 29/7851* (2013.01)

(58) Field of Classification Search
CPC ............. H01L 29/0843; H01L 29/0847; H01L 29/165; H01L 29/41791; H01L 29/66636; H01L 29/66795; H01L 29/7848; H01L 29/785; H01L 29/7851; H01L 29/7853; H01L 29/7855; H01L 2029/7858
See application file for complete search history.

(56) References Cited

U.S. PATENT DOCUMENTS

| | | |
|---|---|---|
| 2013/0011983 A1 | 1/2013 | Tsai et al. |
| 2016/0020301 A1* | 1/2016 | Park ................ H01L 27/0924 257/283 |
| 2016/0049335 A1* | 2/2016 | Liu ................ H01L 21/823412 438/283 |
| 2016/0181383 A1 | 6/2016 | Huang et al. |
| 2017/0250183 A1* | 8/2017 | Brunco ............ H01L 21/76224 |
| 2018/0308797 A1* | 10/2018 | Tsai ................ H01L 29/66545 |
| 2019/0096997 A1 | 3/2019 | More et al. |

* cited by examiner

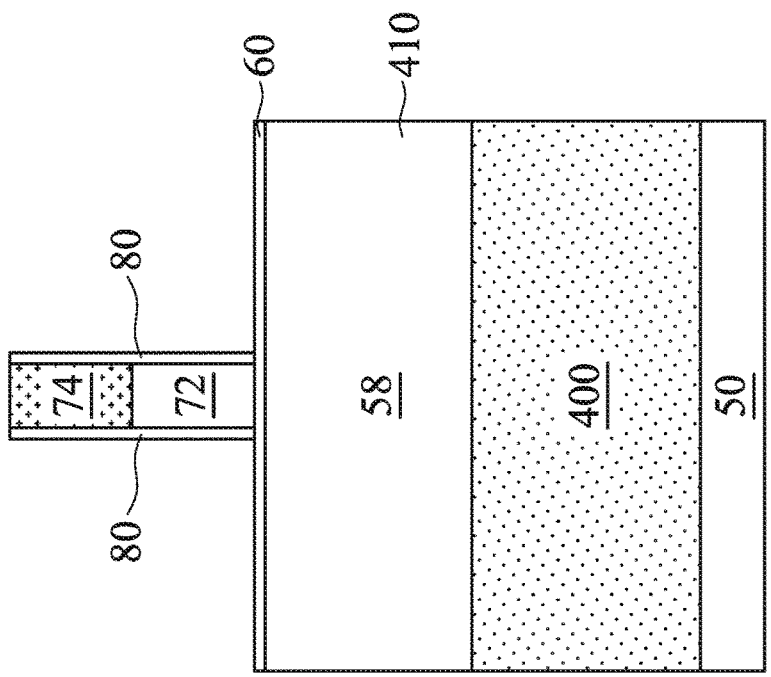
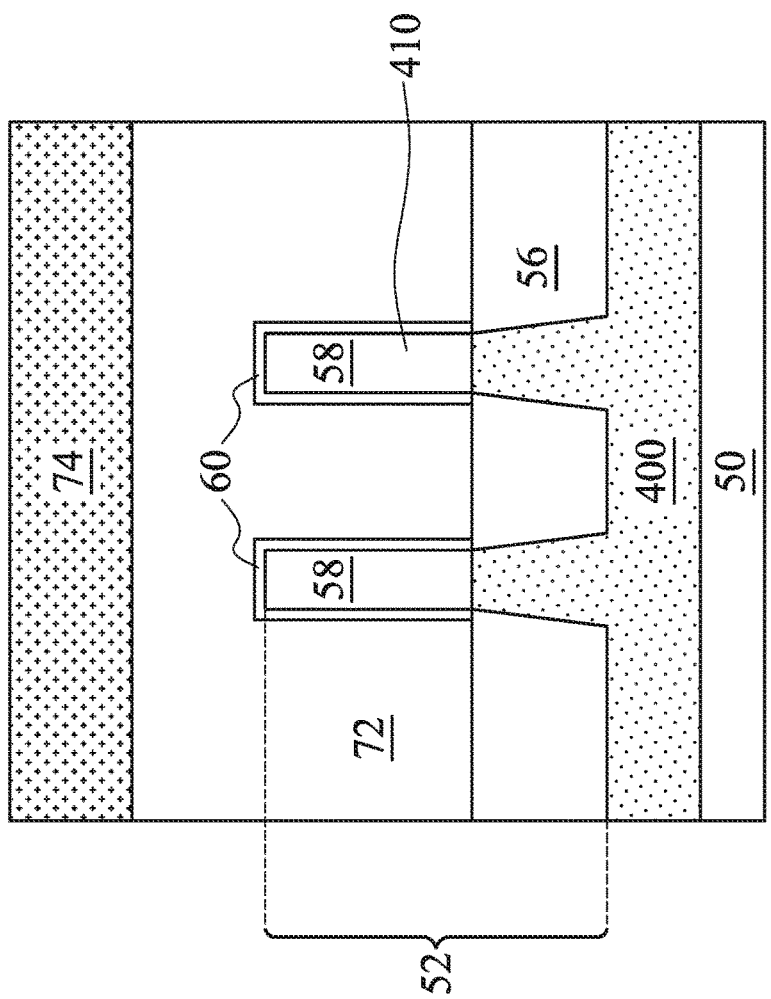
Figure 23A
Figure 23B

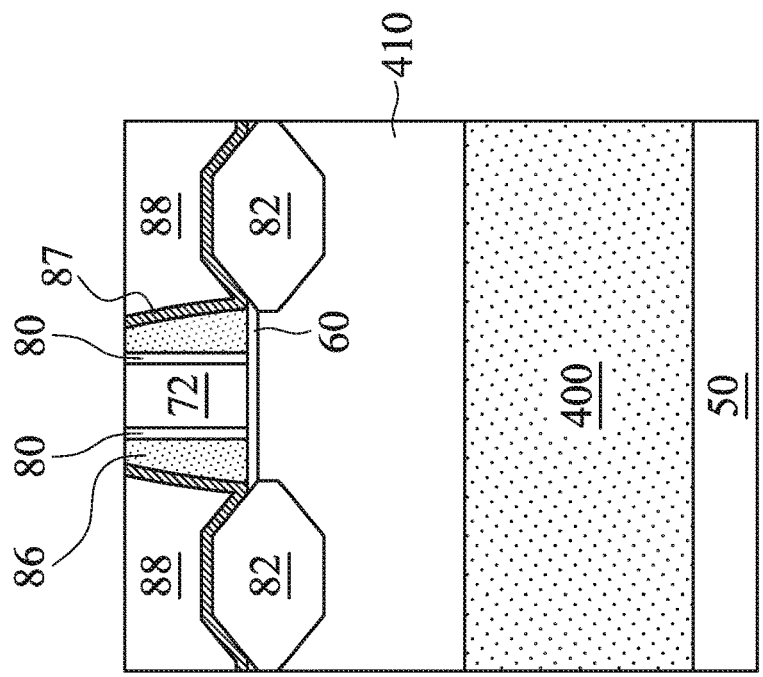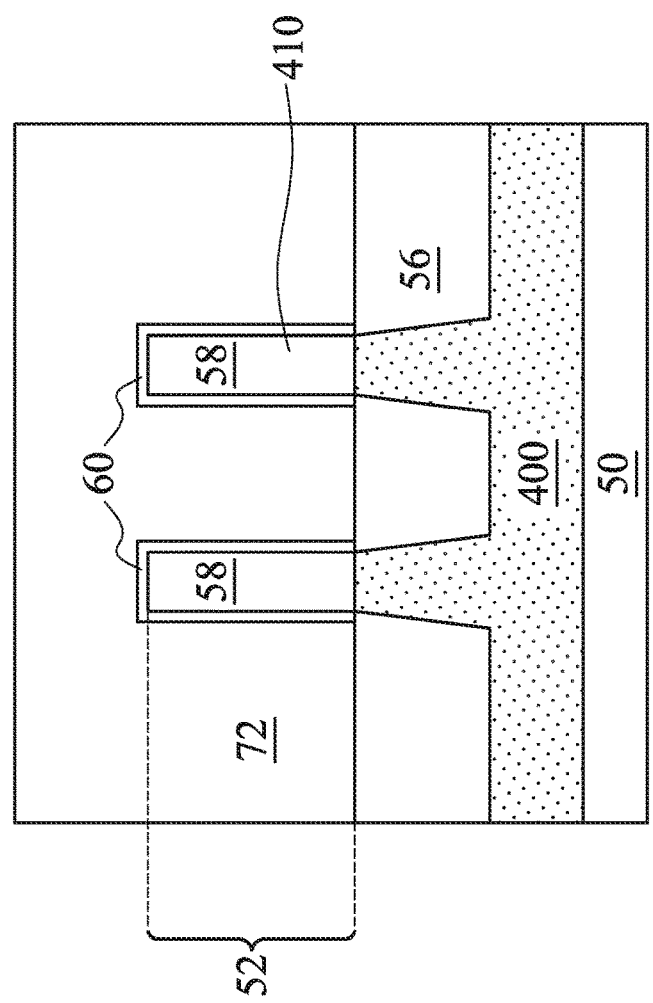
Figure 33B
Figure 33A

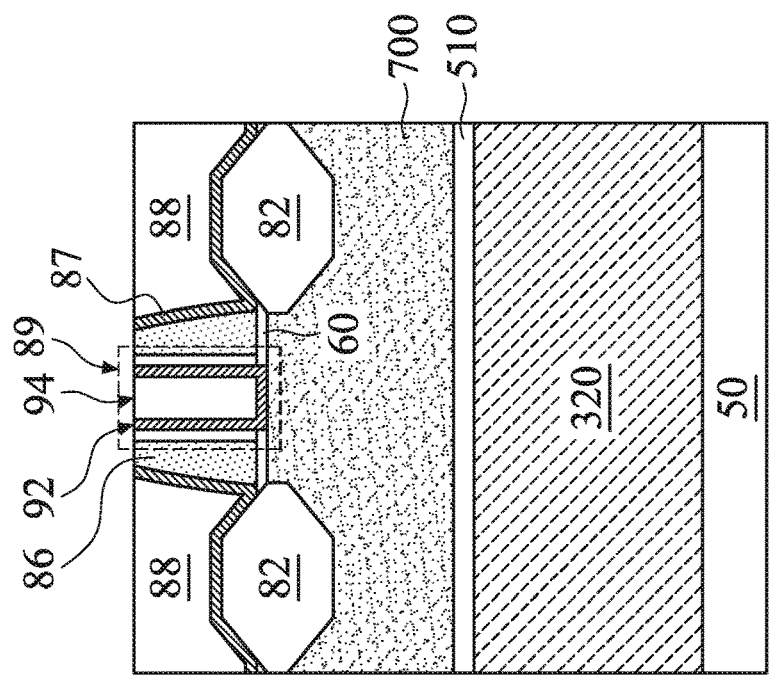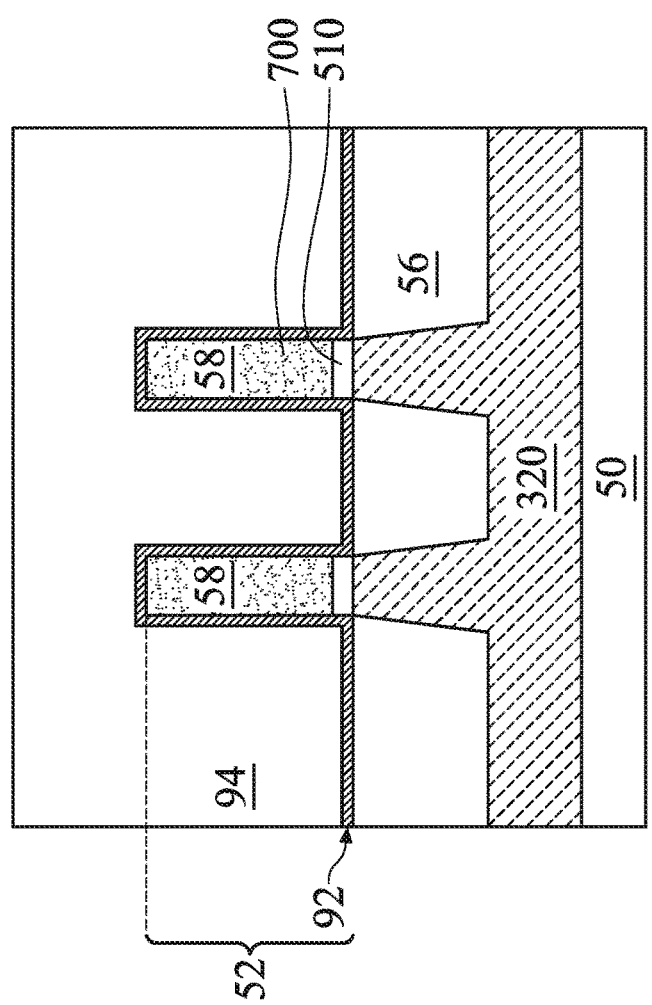
Figure 36B
Figure 36A

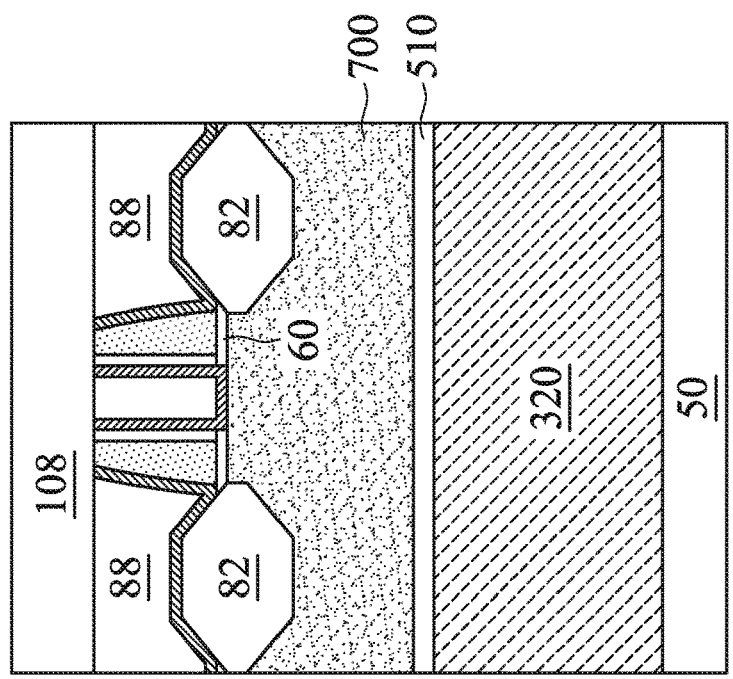
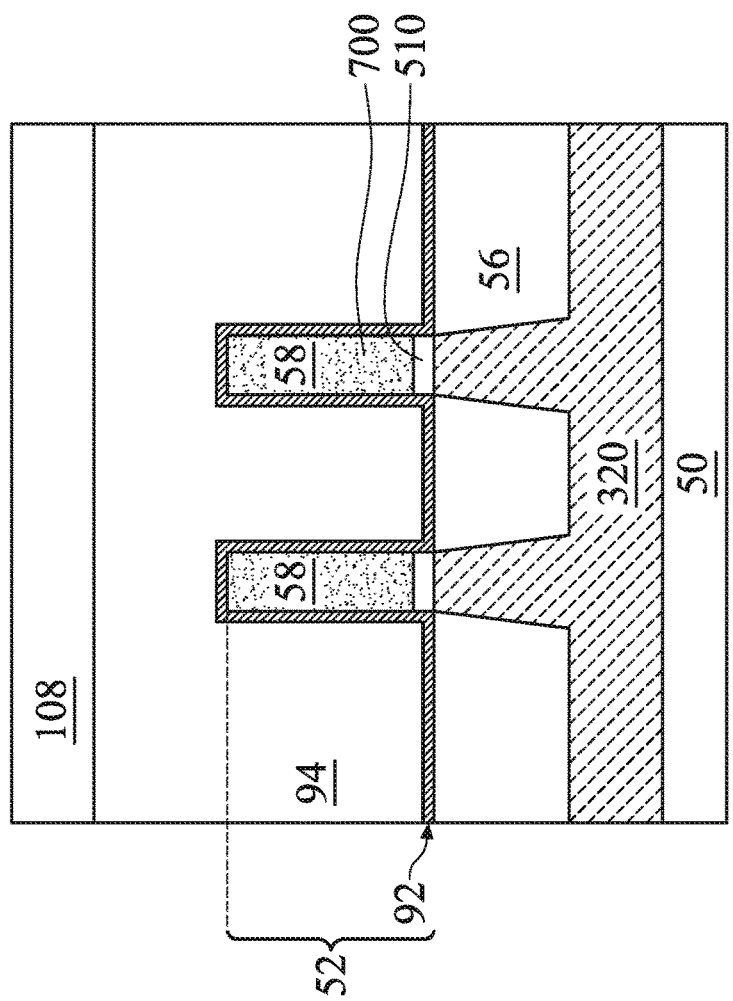
Figure 38B
Figure 38A

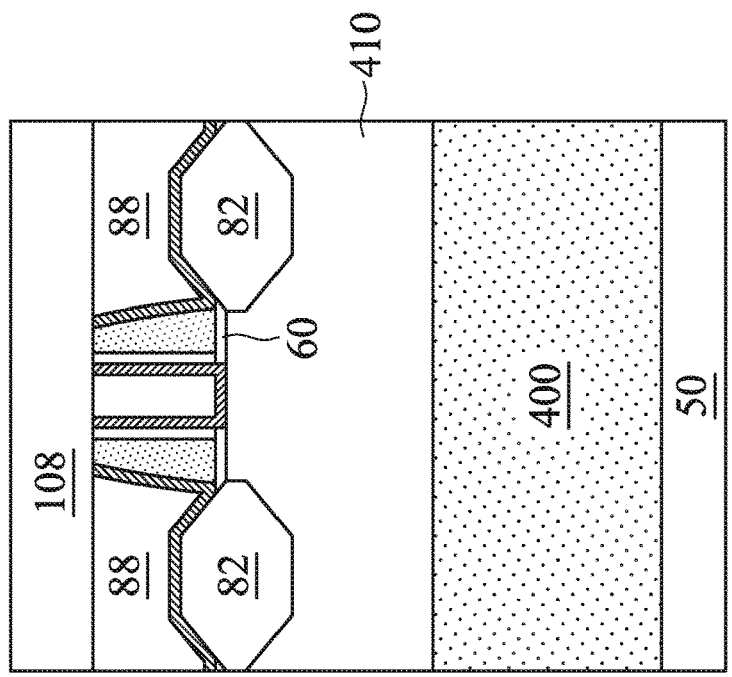
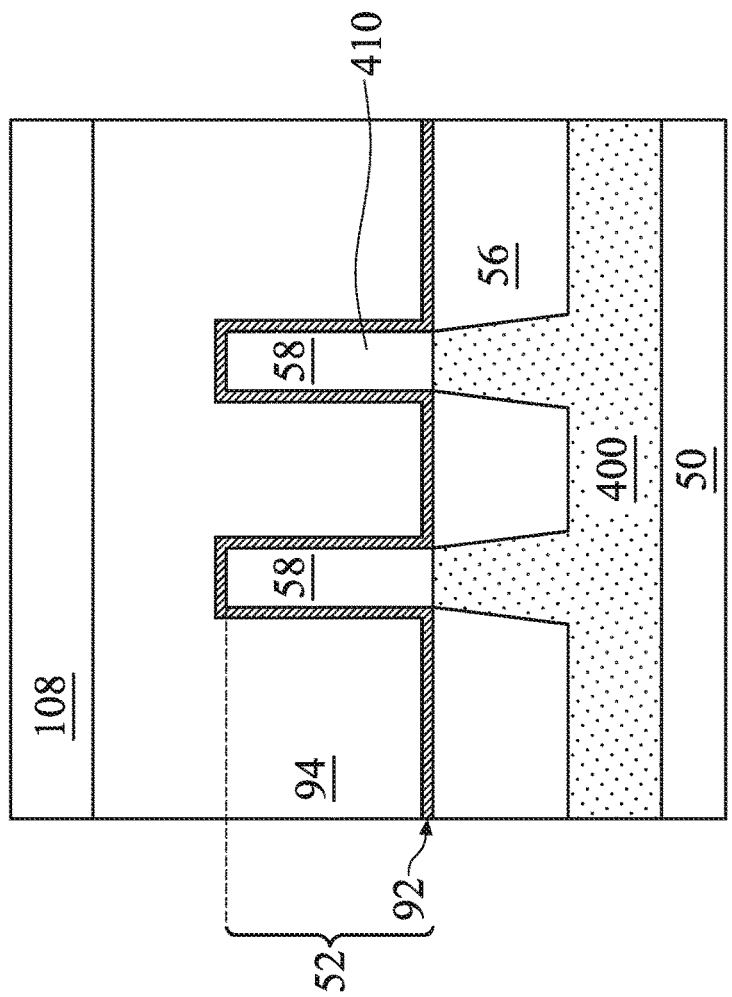
Figure 39A
Figure 39B

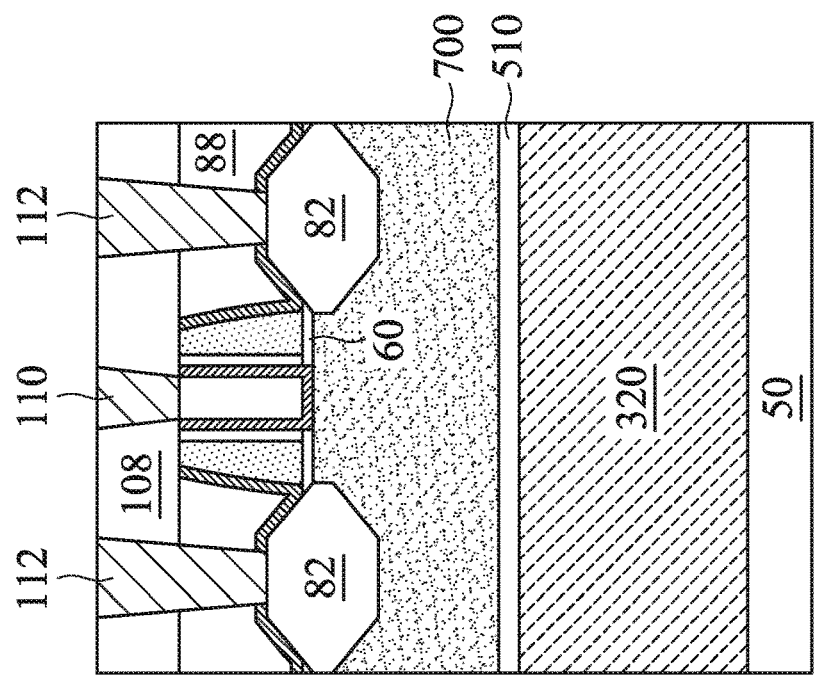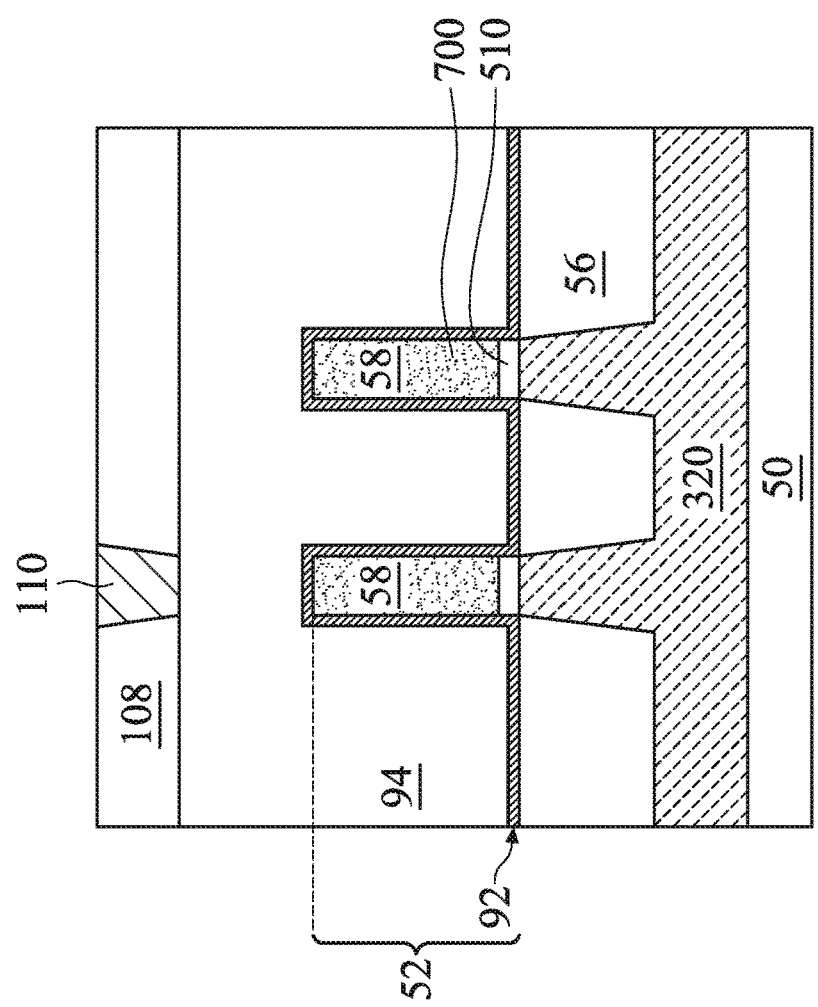
Figure 40A
Figure 40B

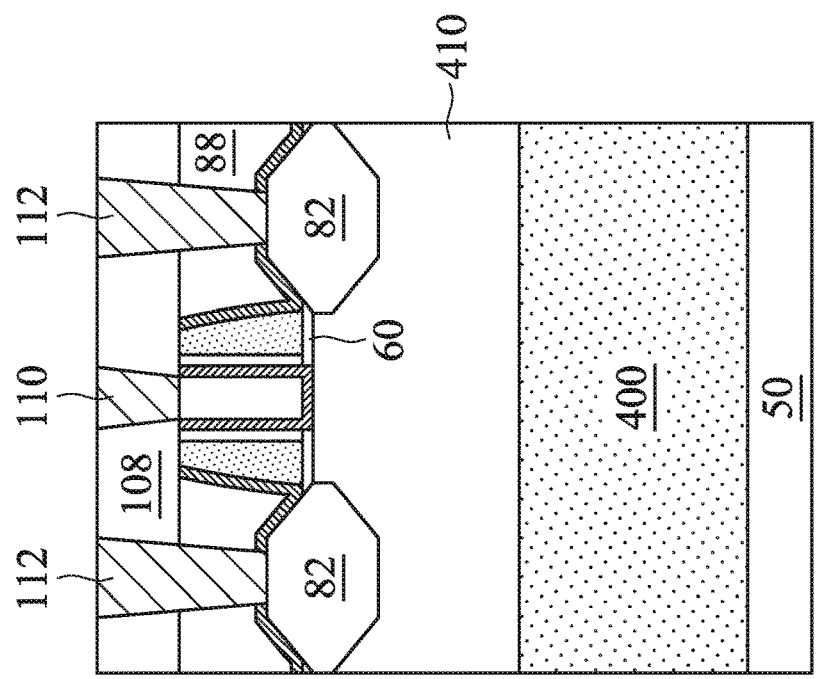
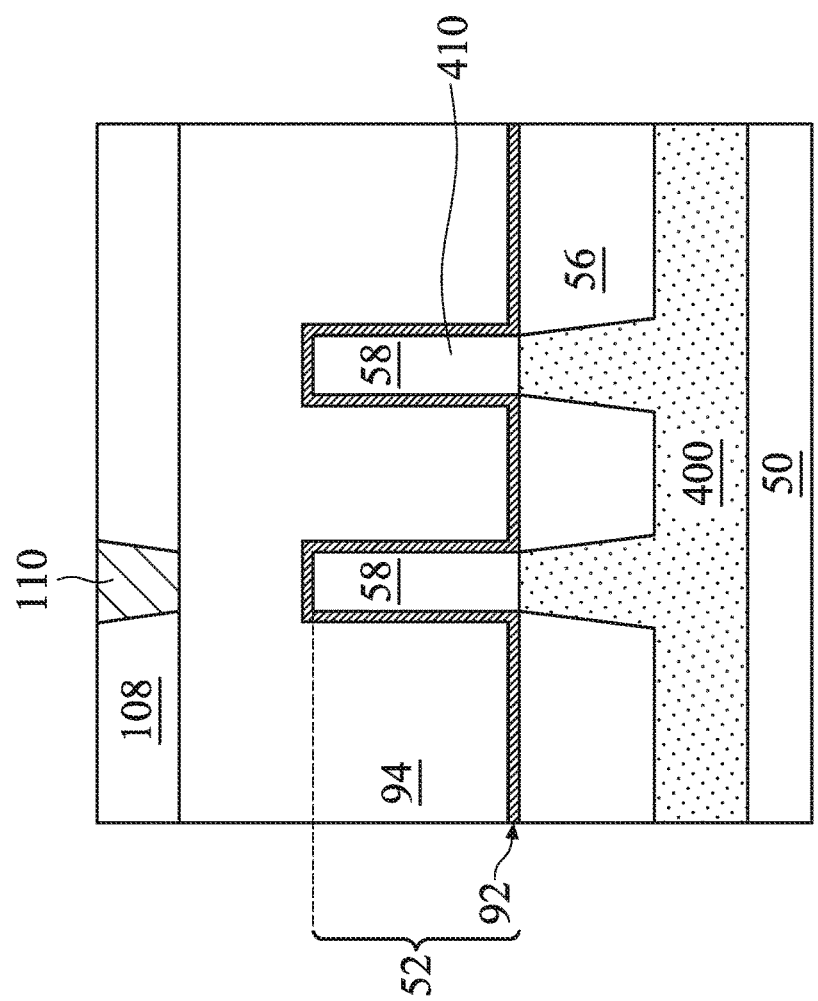
Figure 41A
Figure 41B

FIN FIELD-EFFECT TRANSISTOR DEVICE AND METHOD

PRIORITY CLAIM AND CROSS-REFERENCE

This application claims the benefit of U.S. Provisional Application No. 62/978,756, filed on Feb. 19, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10A, 10B, 12, 13, 14, 15, 16, 17, 18, 19, 20, 21, 22A, 22B, 23A, 23B, 24A, 24B, 25A, 25B, 26A, 26B, 27A, 27B, 28A, 28B, 29A, 29B, 30A, 30B, 31A, 31B, 32A, 32B, 33A, 33B, 34A, 34B, 35A, 35B, 36A, 36B, 37A, 37B, 37C, 38A, 38B, 39A, 39B, 40A, 40B, 41A and 41B are cross-sectional views of intermediate stages in the manufacturing of FinFETs, in accordance with some embodiments.

DETAILED DESCRIPTION

Figure 1:
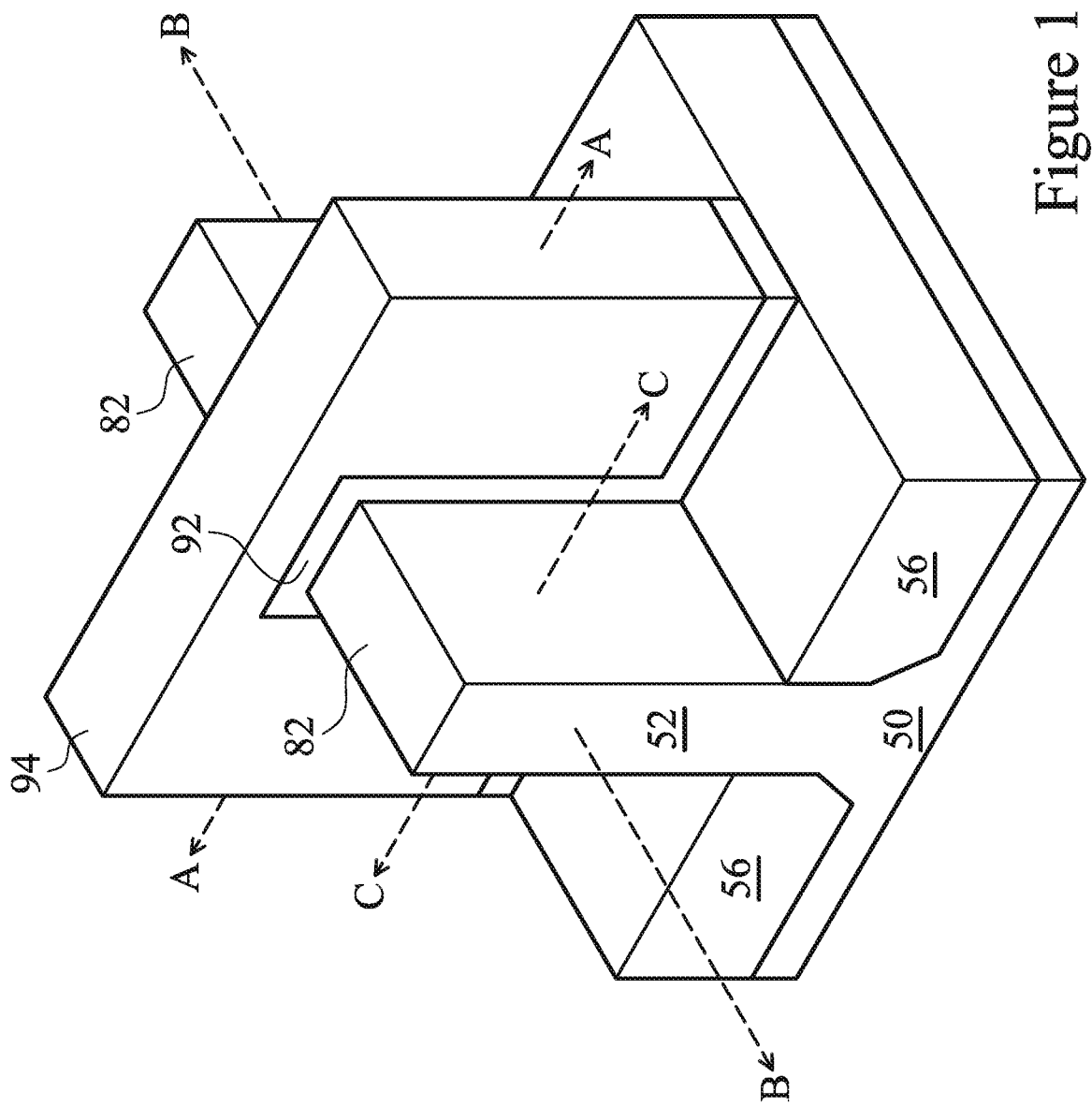
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to, but not limited to the formation of a fully strained p-type channel in a Fin Field-Effect Transistor (FinFET). A fully strained channel in a p-type Fin Field-Effect Transistor (PFET) can improve carrier mobility and reduce channel resistance of the device. The fully strained epitaxial channel in a PFET can be formed from epitaxial layers disposed in an etched recess in a semiconductor fin. Forming the etched recess for the fully strained channel comprises photolithography and etching. In addition, an implant step can be performed on exposed surfaces of the etched recess. These operations may result in undesirable effects, such as damage on the surfaces of the etched recess and the presence of impurities. The surface damage and impurities may result in dislocation defects in the semiconductor material subsequently grown in the etched recess. These dislocation defects may cause device reliability issues, performance degradation, and form device leakage paths. Embodiments disclosed herein include various cleaning steps that may lead to a reduction in surface damage and impurities in the etched recesses. As a result, the number of dislocation defects in the epitaxial layers formed in the etched recess can be reduced. Further, the epitaxial layers may be grown using a high temperature epitaxy process, which further reduces dislocations. Accordingly, device leakage is reduced, device reliability is improved, and the risk of performance degradation is lowered.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 41B are cross-sectional views of intermediate stages in the manufacturing of FinFETs, in accordance with some embodiments. FIGS. 2 through 21 illustrate reference cross-section A-A illustrated in FIG. 1, except for multiple fins/FinFETs. FIGS. 22A, 23A, 24A, 25A, 26A, 27A, 30A, 31A, 32A, 33A, 34A, 35A, 36A, 37A, 38A, 39A, 40A, and 41A are illustrated along reference cross-section A-A illustrated in FIG. 1, and FIGS. 22B, 23B, 24B, 25B, 26B, 27B, 30B, 31B, 32B, 33B, 34B, 35B, 36B, 37B, 38B, 39B, 40B and 41B are illustrated along a similar cross-section B-B illustrated in FIG. 1, except for multiple fins/FinFETs. FIGS. 28A, 28B, 29A and 29B are illustrated along reference cross-section C-C illustrated in FIG. 1, except for multiple fins/FinFETs.

Figure 2:
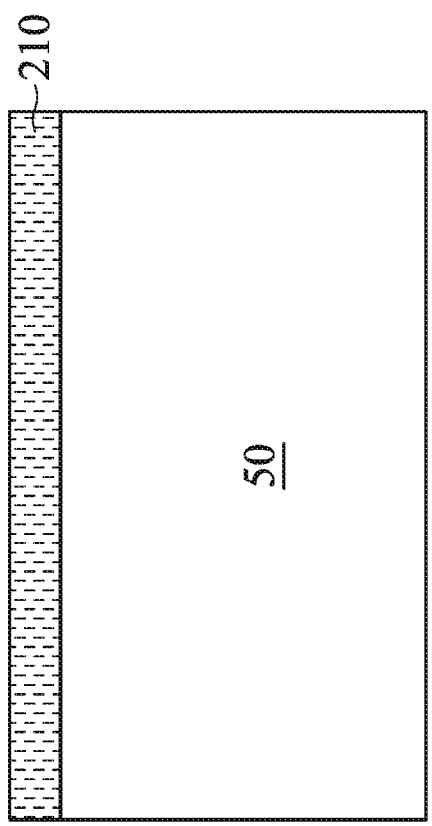

FIG. 2 illustrates the deposition of a dielectric layer 210 on a substrate 50. In some embodiments, the substrate 50 can be a bulk semiconductor wafer or a semiconductor on insulator (SOI) wafer. Further, substrate 50 can be made of silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. For example purposes, the substrate 50 will be described in the context of silicon (e.g., single crystal). Based on the disclosure herein, other materials, as discussed above, can be used. These materials are within the spirit and scope of this disclosure.

The dielectric layer 210 may comprise a dielectric material, such as, silicon oxide, or the like. Dielectric layer 210 may be deposited or thermally grown according to acceptable techniques. In some embodiments, the dielectric layer 210 can have a thickness in a range from about 30 Å to about 150 Å. In accordance with some embodiments, the dielectric layer 210 can protect the top surface of the substrate 50 from contamination, prevent excessive damage to the substrate 50 during ion implantation, and can control the depth of dopants during ion implantation.

Figure 3:
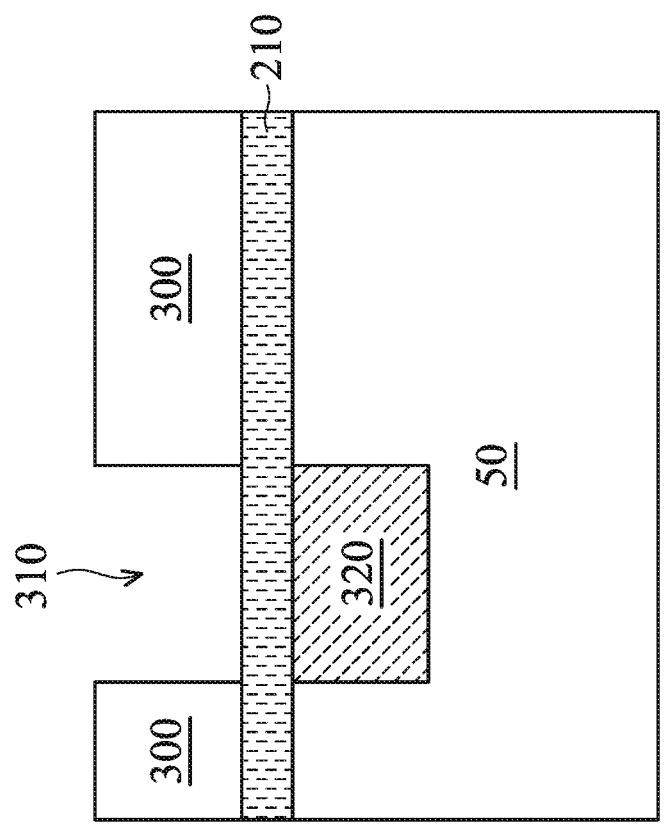

FIG. 3 illustrates the deposition of a photoresist layer 300 over the dielectric layer 210. In accordance with some embodiments, the photoresist layer 300 can be patterned so that an opening 310 is formed over a portion of the dielectric layer 210. Subsequently, an ion implantation is performed through the opening 310 to form, for example, an n-type region 320 in substrate 50. In some embodiments, n-type region 320 is substantially aligned to opening 310 because the photoresist layer 300 can act as an implant mask. In some embodiments, the n-type dopant may include arsenic (As), antimony (Sb), phosphorous (P), or the like. In some embodiments, the n-type dopant concentration in n-type region 320 is in a range from about $5 \times 10^{16}$ atoms/cm$^3$ to about $1 \times 10^{19}$ atoms/cm$^3$. N-type region 320 may have a depth of about 100 nm to about 500 nm. After the formation of n-type region 320, photoresist layer 300 can be removed.

Figure 4:
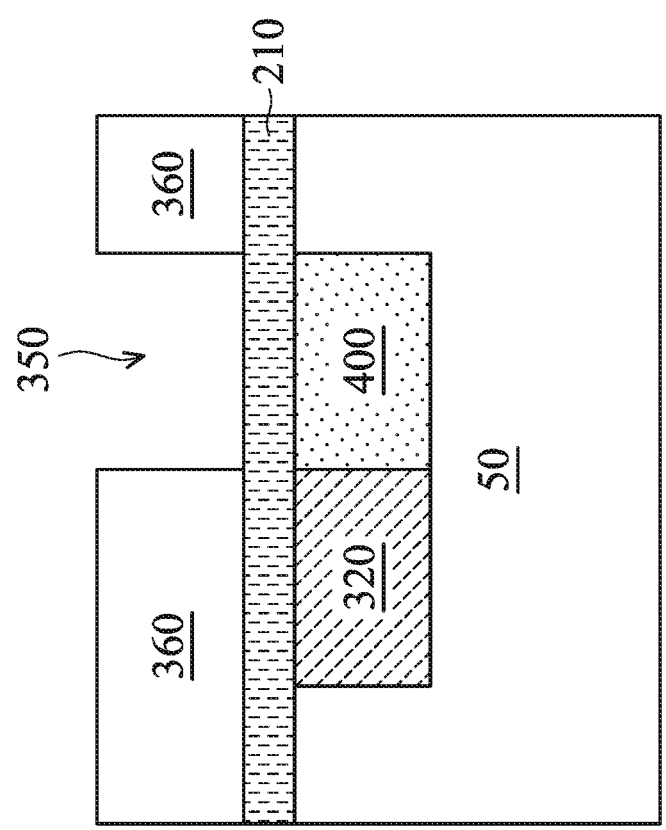

FIG. 4 illustrates the formation of a p-type region 400 in substrate 50 and adjacent to n-type region 320. First, a photoresist layer 360 is deposited and patterned over the dielectric layer 210, defining an opening 350 through the photoresist layer 360. In some embodiments, the p-type region can be created with an ion implantation process using a p-type dopant such as boron (B), or the like. In some embodiments, p-type region 400 can have a dopant concentration that is in a range from about $5 \times 10^{16}$ atoms/cm$^3$ to about $1 \times 10^{19}$ atoms/cm$^3$.

After the formation of n-type and p-type regions 320 and 400, any remaining photoresist layer can be removed with a wet clean process, an ashing process, or the like. In some embodiments, an annealing step is performed to electrically activate the dopants (e.g., move the dopants from interstitial sites to silicon lattice sites) and repair any silicon crystal damage which occurred during the ion implantation step. By way of example, crystal damage repair can occur at about 500° C. and dopant activation can occur at about 950° C. The annealing step can be performed in an annealing furnace or in a rapid thermal anneal (RTA) chamber. In accordance with some embodiments, the dielectric layer 210 can be removed after the dopant activation anneal.

Figure 5:
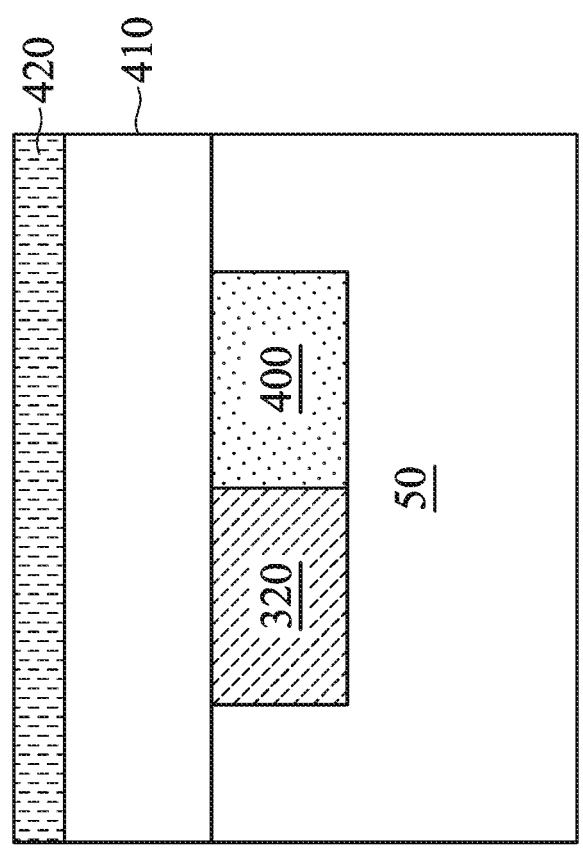

In FIG. 5, an epitaxial semiconductor layer 410 is formed on the substrate 50. The semiconductor layer 410 may comprise a semiconductor material, such as silicon, or the like. In some embodiments, the semiconductor layer 410 may have a thickness in a range from about 300 Å to about 1000 Å. The semiconductor layer 410 may be deposited using a process such as chemical vapor deposition (CVD), or the like. Source gases for the semiconductor layer 410 formation may include silane (SiH$_4$), silicon tetrachloride (SiCl$_4$), trichlorosilane (TCS), dichlorosilane (SiH$_2$Cl$_2$ or DSC), or the like. Hydrogen (H$_2$) may be used as a reactant gas that reduces the aforementioned source gases. The deposition temperature during deposition of the semiconductor layer 410 can be in a range from about 700° C. to about 1250° C. depending on the gases used although other temperatures may be used in other embodiments. For example, source gases with fewer chlorine atoms (e.g., DSC) may require lower formation temperatures compared to source gases with more chlorine atoms, such as SiCl$_4$ or TCS.

A cap layer 420 may be formed on top of the semiconductor layer 410, according to some embodiments. The cap layer 420 may have a thickness in a range from about 150 Å to about 300 Å. In some embodiments, the cap layer 420 may be an oxide layer such as SiO$_2$, or the like. Alternatively, the cap layer 420 may be a nitride, such as Si$_3$N$_4$, or the like. The cap layer 420 may be deposited or thermally grown according to acceptable techniques.

Figure 6:
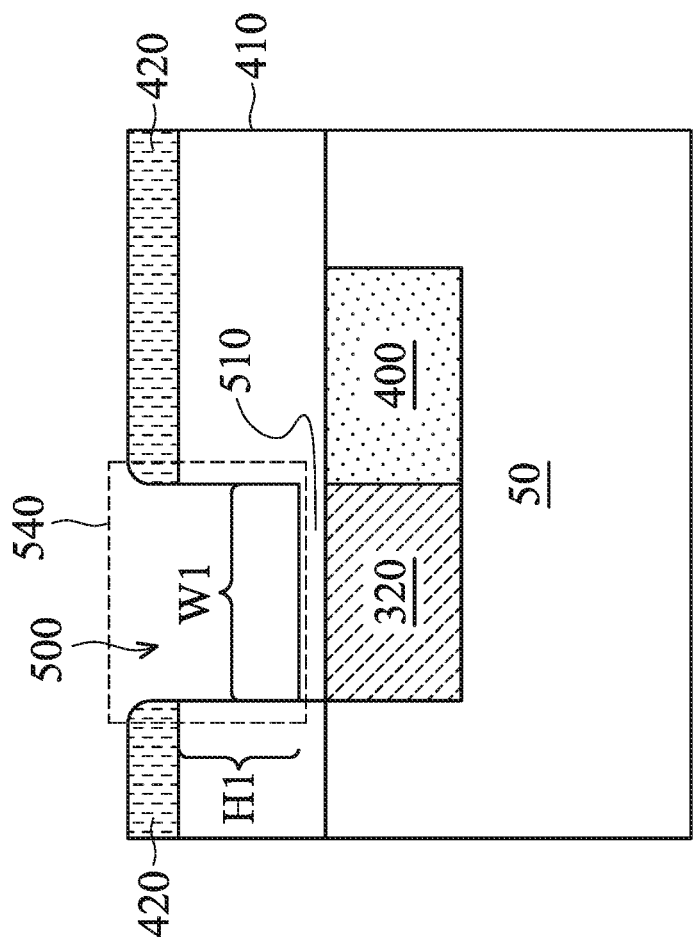

FIG. 6 illustrates the formation of the recess 500 in the semiconductor layer 410. In some embodiments, the recess 500 can be aligned to n-type region 320. Alignment of the recess 500 with n-type region 320 can be achieved, for example, through photolithography. For example, a photoresist may be applied on the semiconductor layer 410, which is then patterned to form openings. Patterning the photoresist may be performed using a combination of exposure, development, and/or cleaning processes. The pattern of the photoresist is then transferred to the cap layer 420 and the semiconductor layer 410 to define the recess 500. Transferring the pattern of the photoresist may be achieved using one or more dry and/or wet etch processes, or the like. For example, a plasma etching process may be used to transfer the pattern of the photoresist to the cap layer 420 and the semiconductor layer 410 to define the recess 500. Patterning the recess 500 in the semiconductor layer 410 can be timed so that a semiconductor region 510 of the semiconductor layer 410 is not removed. The region 510 may be disposed on top of n-type region 320. According to some embodiments, the thickness of the remaining semiconductor region 510 on top of n-type region 320 can range from about 50 Å to about 100 Å. In some embodiments, the etch processes can use different etch chemistries to etch the cap layer 420 and the semiconductor layer 410.

As a result of the etching process to form the recess 500, impurities (e.g., etching residue) and surface damage may be present on sidewalls and a bottom surface of the recess 500. The surface damage may include, for example, dangling bonds formed as a result of ion bombardment from a plasma etching process. These impurities and surface damage may cause dislocation defects in an epitaxial region subsequently grown in the recess 500. Various embodiments apply a multistep cleaning process to remove impurities and the surface damage regions in the recess 500, so that epitaxial regions can be grown in the recess 500 with fewer defects.

In some embodiments, the recess 500 has a width W1 and a height H1. The width W1 can be in a range from about 1000 Å to about 5000 Å and can be nominally equal to the width of n-type region 320. In some embodiments, the recess 500 can have a height H1 that is equal to the difference between the thickness of the semiconductor layer 410 and the thickness of the semiconductor region 510 at the bottom of the recess 500.

FIGS. 7 through 11 illustrate surface pre-clean treatments performed to prepare the surface of the recess 500 according to various embodiments. In some embodiments, the surface pre-clean treatments are designed to treat and remove contaminants (including remnants of photoresist) from surfaces of the recess 500 in the semiconductor layer 410. The surface pre-clean treatments may further remove damaged surfaces (e.g., sidewalls and the bottom surface) of the recess 500. Surfaces of the semiconductor layer 410 that are covered by the cap layer 420 (e.g., the top surface of the semiconductor layer 410 over p-type region 400) are not exposed to the surface pre-clean treatments and are therefore not treated. The pre-clean treatments performed may comprise wet processes (e.g., when contaminants are carried out in a liquid-phase) and/or dry processes (e.g., when contaminants are carried out in a gas-phase).

Figure 7:
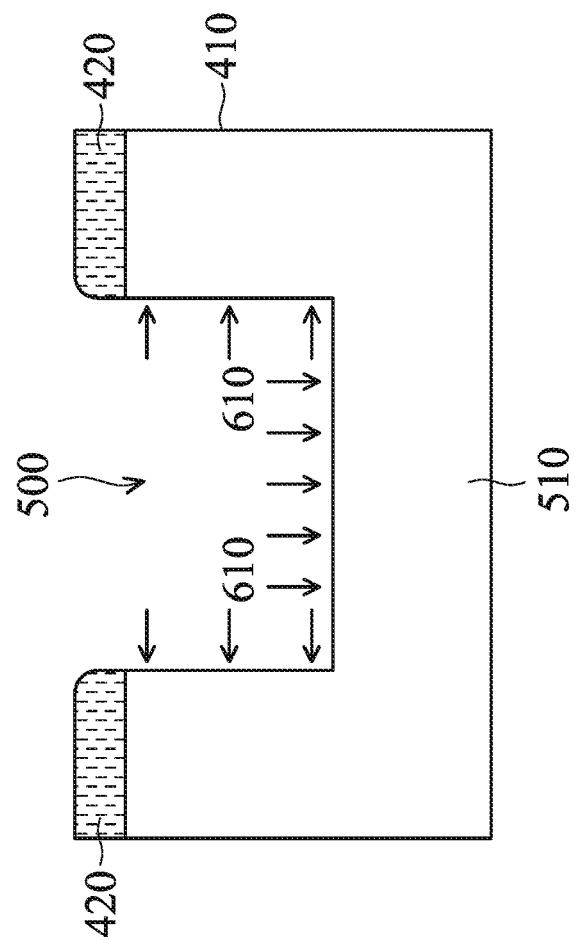

FIG. 7 is a magnified view of an area 540 shown in FIG. 6. FIG. 7 illustrates a first clean 610 being performed on the exposed surfaces of the recess 500. The first clean 610 may comprise one or more wet processes, according to some embodiments. The first clean 610 may comprise exposing surfaces of the recess 500 to a diluted hydrofluoric acid (dHF) solution, which removes a native oxide layer on the exposed surfaces of the recess 500 and further removes contaminants (e.g., metal contaminants) adsorbed or trapped within the oxide layer. The etching rate and uniformity of dHF solution depends on the composition and temperature of the solution. The first clean 610 may further comprise exposing surfaces of the recess 500 to a mixture of sulfuric acid ($H_2SO_4$) and hydrogen peroxide ($H_2O_2$) at a temperature in a range from about 30° C. to about 180° C., such as about 80° C., to remove organic contaminants that may be present on the surfaces of the recess 500. The mixture of sulfuric acid and hydrogen peroxide may be referred to as a Sulphur peroxide mixture (SPM). The first clean 610 may also comprise exposing surfaces of the recess 500 to an alkaline mixture of ammonium hydroxide ($NH_4OH$), hydrogen peroxide ($H_2O_2$), and water to remove other organic contaminants as well as other particles.

Figure 8:
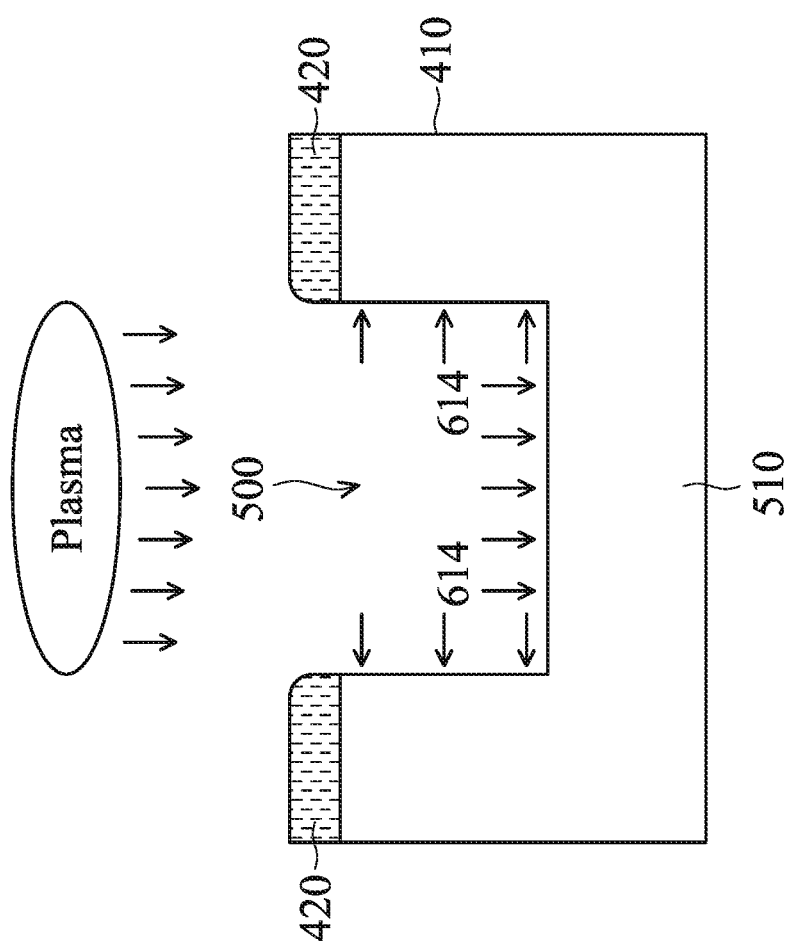

FIG. 8 illustrates a second clean 614 being performed on the exposed surfaces of the recess 500. The second clean 614 may be a dry process, such as a plasma ashing process that is used to remove organic matter from the exposed surfaces of the recess 500 through the application of plasma. In addition, the plasma ashing process may be used to smoothen roughened surfaces of recess 500 that result from the etching process (described earlier in FIG. 6) used to form the recess 500. For example, as a result of the second clean 614, a surface roughness of surfaces in the recess 500 may be reduced. In some embodiments, the plasma can include chlorine gas, or the like. According to some embodiments, the power provided to the plasma can be radio frequency (RF), direct current (DC), combinations thereof, or the like. The second clean 614 is performed at a temperature in a range from about 20° C. to about 90° C., such as about 60° C.

Figure 9:
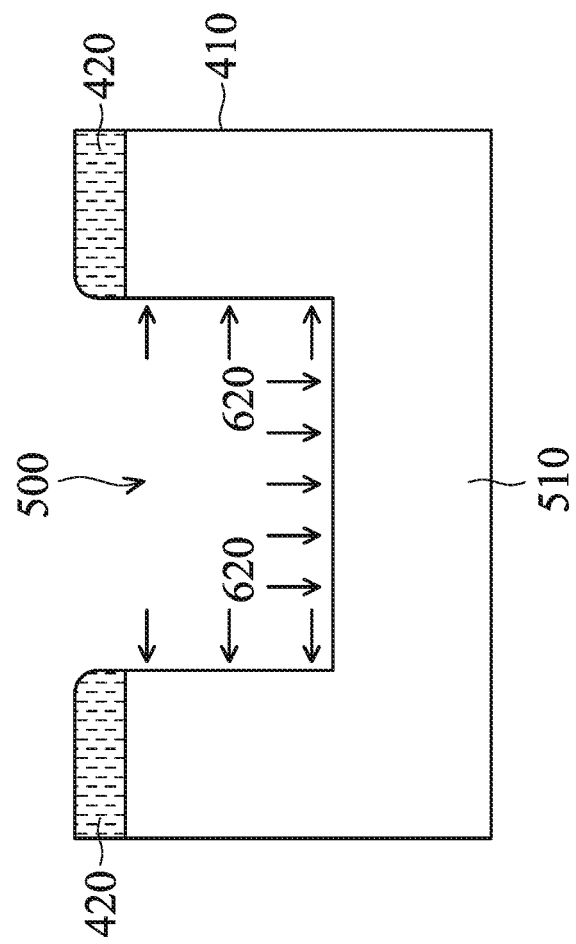

FIG. 9 illustrates a third clean 620 being performed on the exposed surfaces of the recess 500. The third clean 620 may comprise one or more wet processes, according to some embodiments. The third clean 620 may comprise exposing surfaces of the recess 500 to a mixture of sulfuric acid ($H_2SO_4$) and hydrogen peroxide ($H_2O_2$) to remove organic contaminants from the surfaces of the recess 500. The third clean 620 may also comprise exposing surfaces of the recess 500 to an alkaline mixture of ammonium hydroxide ($NH_4OH$), hydrogen peroxide ($H_2O_2$), and water to remove other organic contaminants as well as other particles. In some embodiments, the organic contaminants and particles may result from the second clean 610 discussed in FIG. 8.

Figure 10A:
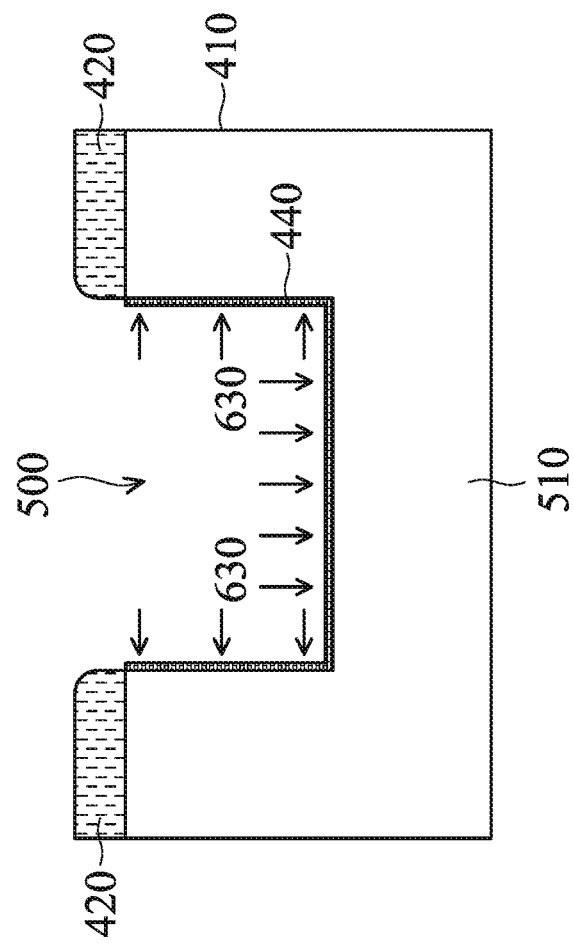
Figure 10B:
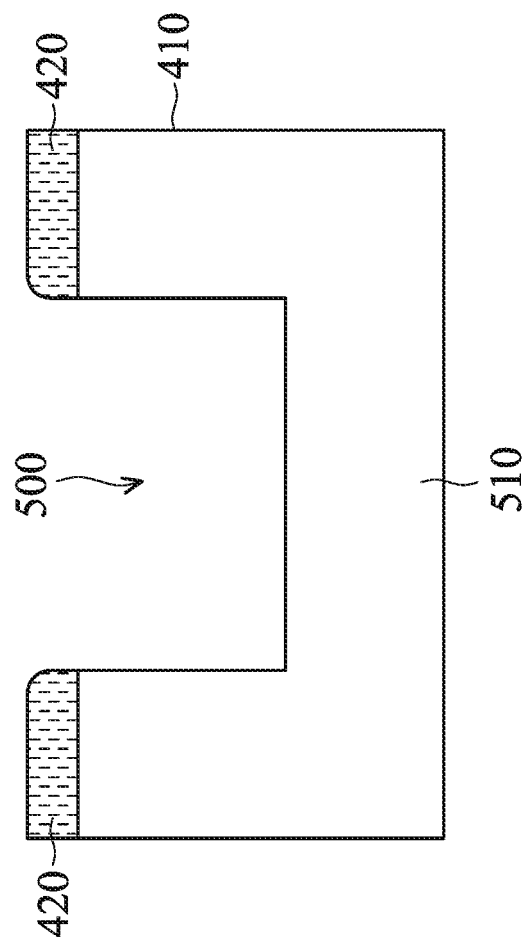

FIGS. 10A and 10B illustrate a fourth clean 630 that is performed on the exposed surfaces of the recess 500. The fourth clean 630 may comprise a wet process. The fourth clean 630 may be a cyclic process that is used to remove damaged portions of the surfaces of the recess 500 that may have defects caused by the etching process (described earlier in FIG. 6 used to form the recess 500. FIGS. 10A and 10B illustrate one cycle of the cyclic, fourth clean 630. However, the fourth clean 630 may have any number of cycles. For example, the steps illustrated in FIGS. 10A and 10B may be repeated any number of times until a desired amount of the semiconductor layer 410 is removed from the recess 500. The removed portions of the semiconductor layer 410 may correspond to portions of the semiconductor layer 410 damaged as a result of etching the recess 500.

FIG. 10A illustrates exposing surfaces of the recess 500 to a process gas comprising ozone ($O_3$). The process gas may be used to form an oxide layer 440 on the exposed surfaces of the recess 500 as a result of oxidation of the semiconductor layer 410 by the $O_3$. The formation of the oxide layer 440 on the exposed surfaces of the recess 500 is a self-limiting process. For example, formation of the oxide layer 440 continues until the surfaces of the recess 500 are saturated with oxygen. The oxide layer 440 may have a thickness in a range from about 1 nm to 2 nm.

Next, in FIG. 10B, the oxide layer 440 is etched using dilute hydrofluoric (dHF) acid, for example. In other embodiments, a different etchant may be used. The dHF acid (or other etchant) allows the oxide layer 440 to be etched selective to the material of the semiconductor layer 410. Accordingly, the oxide layer 440 can be removed without significantly attacking the underlying semiconductor layer 410. Because the formation of the oxide layer 440 on the exposed surfaces of the recess 500 is a self-limiting process, the amount of material from the surfaces of the recess 500 that may be removed during each cycle of the fourth clean 630 can be precisely controlled. The cycle illustrated in FIGS. 10A and 10B may be repeated any number of times until a desired thickness of material from the surfaces of the recess 500 is removed. In an example, one cycle of oxidation and etching is performed. In other embodiments, a different number of cycles may be used. The fourth clean 630 may be performed at a temperature in a range from about 10° C. to about 45° C., such as about 25° C.

Figure 11:
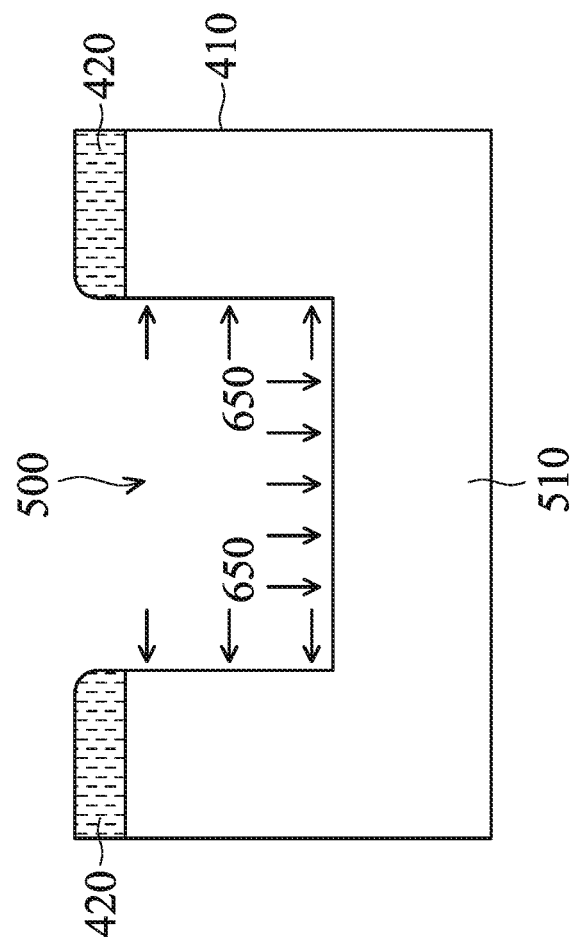
FIG. 11 is a cross-sectional view of an intermediate stage in the manufacturing of FinFETs, according to alternative embodiments.

FIG. 11 illustrates a pre-clean treatment process that is performed after the third clean 620 (described earlier in FIG. 9) according to alternative embodiments. FIG. 11 illustrates a fourth clean 650 that is performed on the exposed surfaces of the recess 500 as an alternative to the fourth clean 630 described in FIGS. 10A and 10B. The fourth clean 650 may comprise one or more wet processes, according to some embodiments. The fourth clean 650 may comprise exposing surfaces of the recess 500 to an alkaline mixture of ammonium hydroxide ($NH_4OH$), hydrogen peroxide ($H_2O_2$), and water to remove organic contaminants as well as particles. The fourth clean 650 may comprise exposing surfaces of the recess 500 to a dilute hydrofluoric (dHF) acid solution that is used to remove an oxide layer that may be formed on the exposed surfaces of the recess 500 during the fourth clean 650, and further removes contaminants (e.g., metal contaminants) adsorbed or trapped within the oxide layer. In some embodiments, the oxide layer may be formed as a result of exposing the recess 600 to the alkaline mixture of ammonium hydroxide ($NH_4OH$), hydrogen peroxide ($H_2O_2$), and water, for example. The removal of the oxide layer is used to remove damaged portions of the surfaces of the recess 500 that may have defects caused by the etching process (described earlier in FIG. 6) used to form the recess 500. The fourth clean 650 may expose surfaces of the recess 500 to a mixture of hydrochloric acid (HCl) and hydrogen peroxide ($H_2O_2$) to dissolve metallic contamination that may be present on the surfaces of the recess 500. The metal contaminants dissolve due to the acidic nature of the solution. The fourth clean 650 may also comprise a deionized water rinse and dry cycle.

Figure 12:
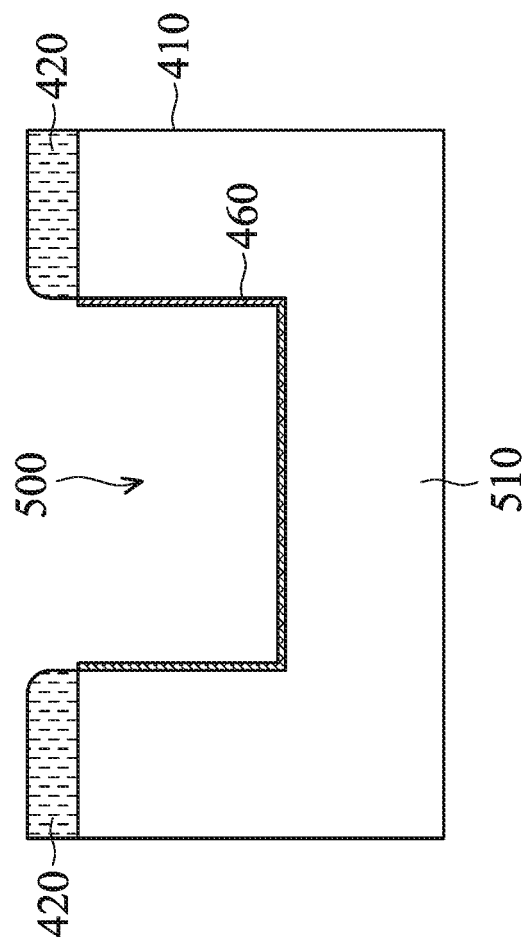

FIG. 12 illustrates the formation of a seed layer 460 on the exposed surfaces of the recess 500. According to some embodiments, the seed layer 460 cannot be grown on the cap layer 420; for example, the seed layer 460 cannot grow on $SiO_2$ or $Si_3N_4$. According to some embodiments, the seed layer 460 may be a Si layer, Si:C layer, a SiGe layer, or a combination thereof with a thickness that ranges from about 30 Å to about 100 Å. For example, the seed layer 460 can be Si/Si:C/SiGe, Si/SiGe, or Si:C/SiGe. According so some embodiments, the atomic percentage (at. %) of carbon dopant in Si:C can be from about 0.01 at. % to about 2 at. %. In some embodiments, the seed layer 460 is not sufficiently thick to fill the recess 500. As a result, the seed layer 460 covers the exposed surfaces of recess 500 and cannot fill the recess 500. The seed layer 460 can be deposited by a CVD process, or the like. For example, $SiH_4$, DCS, or a combination thereof can be used in the presence of $H_2$, $N_2$, or the like to form a seed layer 460 that comprises silicon. A combination of (i) $SiH_4$, disilane ($Si_2H_6$), germane ($GeH_4$), or hydrochloric acid (HCl), and (ii) $H_2$, $N_2$, He, Ar, or the like can be used to form a seed layer 460 that comprises silicon germanium.

In some embodiments, a deposition temperature T1 of the seed layer 460 may be greater than a growth temperature T3 of a subsequently grown epitaxial layer (described subsequently in FIG. 13). The deposition temperature T1 of the seed layer 460 can range from about 600° C. to about 750° C., such as 750° C. According to some embodiments, a higher quality seed layer 460 (e.g., with fewer defects) can be achieved at the upper limit of the T1 range (e.g., about 750° C.). In some embodiments, the seed layer 460 formation process can range from about 5 Torr to about 30 Torr, such as 20 Torr. According to some embodiments, a deposition process time of the seed layer 460 can range from about 5 s to about 15 s, such as 10 s. The deposition process time of the seed layer may depend on the growth rate and the desired thickness of the seed layer 460. In some alternative embodiments, a deposition temperature T2 of the seed layer 460 may be greater than a growth temperature T3 of a subsequently grown epitaxial layer (described subsequently in FIG. 13). The deposition temperature T2 of the seed layer 460 can range from about 600° C. to about 750° C., such as 700° C. In some embodiments, the seed layer 460 formation process can range from about 5 Torr to about 30 Torr, such as 20 Torr. According to some embodiments, the deposition process time of the seed layer 460 can range from about 5 s to about 100 s, such as 30 s.

Figure 13:
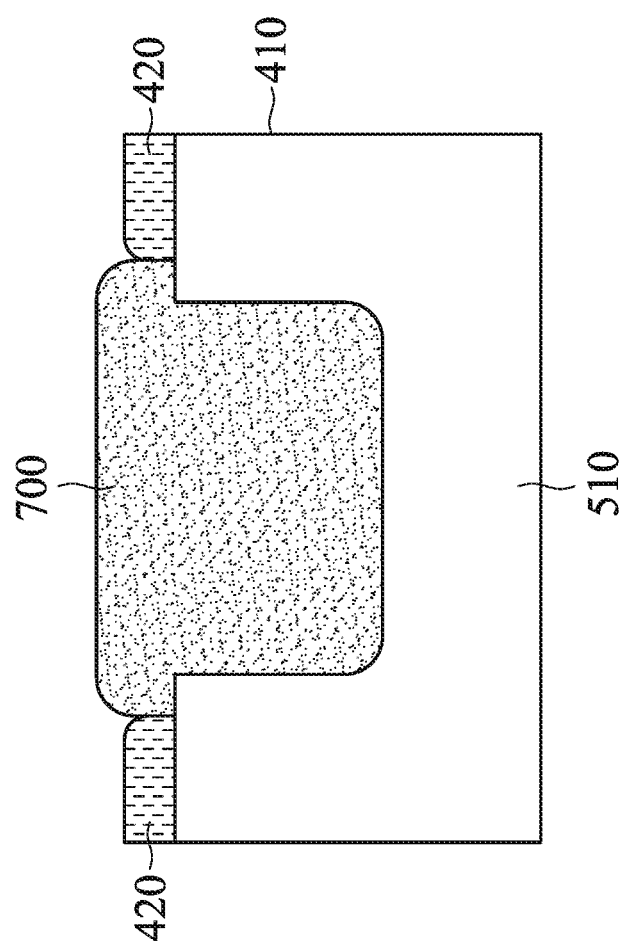

FIG. 13 illustrates the formation of an epitaxial layer 700 on the seed layer 460 to fill the recess 500. According to some embodiments, the epitaxial layer 700 comprises silicon germanium and can be grown at a temperature T3. Growth temperature T3 can range from about 550° C. to about 700° C., such as 660° C. As discussed above, T3 can be lower than T1 and T2. In some embodiments, the epitaxial layer 700 formation process can range from about 10 Torr to about 80 Torr, such as 20 Torr. Precursor gases that can be used for the epitaxial layer 700 growth may include a combination of (i) $SiH_4$, $Si_2H_6$, $SiH_2Cl_2$, $GeH_4$, or HCl, and (ii) $H_2$, $N_2$, Ar, or the like. In some embodiments, the germanium concentration in atomic percentage (at. %) is constant throughout the thickness of the epitaxial layer 700 and can range from about 20 at. % to about 40 at. %. In some embodiments, the epitaxial layer 700 may include a first sub-layer that has a Ge concentration up to about 5 at. % and a second sub-layer with a constant Ge concentration throughout the thickness of the epitaxial layer 700 ranging from about 20 at. % to about 40 at. %. The thickness of the first sub-layer can range from about 20 Å to about 100 Å.

Epitaxial layer 700 does not grow on capping layer 420. For example, epitaxial layer 700, which comprises silicon germanium, does not generally grow on $SiO_2$ or $Si_3N_4$. According to some embodiments, the sidewalls of the recess 500, after the growth of epitaxial layer 700, can be substantially vertical in relation to the bottom surface of the recess 500; for example, the angle between the bottom surface of the recess 500 and a sidewall of the recess 500 can range from about 90° to about 100°. The epitaxial layer 700 may be strained and/or apply strain to the underlying semiconductor layer 410 due to the lattice mismatch between the material of the epitaxial layer 700 (e.g., silicon germanium) and the material of the semiconductor layer 410 (e.g., silicon). In subsequently process steps, portions of the epitaxial layer 700 and the semiconductor layer 410 may be patterned into channel regions of a PFET. Due to the strain, the resulting channel regions may be referred to as fully strained epitaxial channels.

In an embodiment, a fully strained epitaxial channel in a PFET formed using the pre-clean treatment and seed layer formation process described in FIGS. 10A, 10B and 12 may allow for the formation of a fully strained channel in a PFET that has a dislocation defect density lower than 50 $cm^{-2}$.

In an alternative embodiment, a fully strained epitaxial channel in a PFET formed using the pre-clean treatment and seed layer formation process described in FIGS. 11 and 12 may allow for the formation of a fully strained channel in a PFET that has a dislocation defect density lower than $10^3$ $cm^{-2}$.

Figure 14:
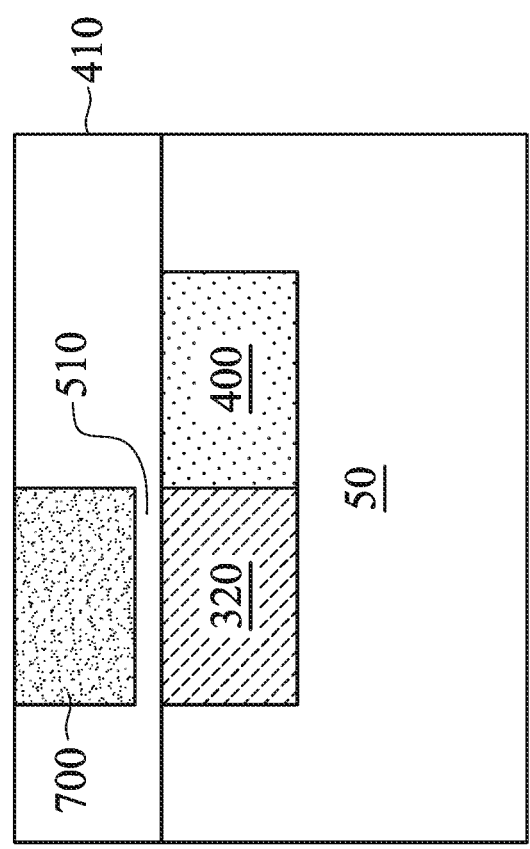

FIG. 14 illustrates a subsequent CMP process used to planarize the epitaxial layer 700 and the semiconductor layer 410. During the CMP operation, the cap layer 420, and a portion of the epitaxial layer 700/semiconductor layer 410, can be removed. After the CMP process, top surfaces of the semiconductor layer 410 and the epitaxial layer 700 are level.

Figure 15:
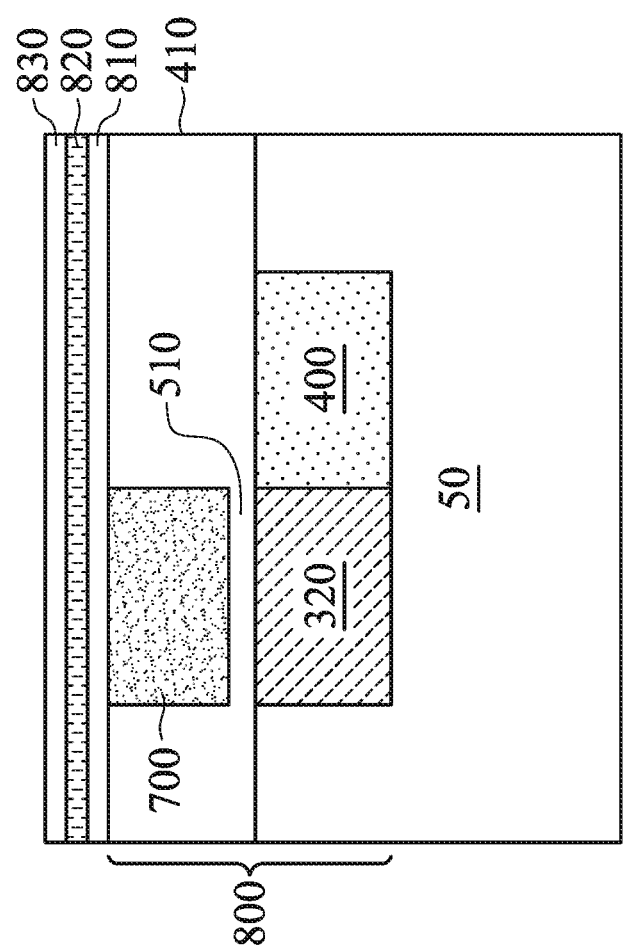

FIG. 15 illustrates the deposition of a semiconductor layer 810 over the planarized surfaces of the epitaxial layer 700 and the semiconductor layer 410. The semiconductor layer 810 may comprise a semiconductor material, such as silicon, or the like. In some embodiments, the thickness of the semiconductor layer 810 can range from about 10 Å to about 100 Å, such as about 30 Å, and can be grown with similar methods used to grow semiconductor layer 410. Subsequently, a dielectric layer 820 and a dielectric layer 830 can be deposited over the semiconductor layer 810. The dielectric layer 820 may comprise a dielectric material, such as, silicon oxide, or the like. Dielectric layer 820 may be deposited or thermally grown according to acceptable techniques. The dielectric layer 830 may comprise a dielectric material, such as, silicon nitride, or the like, that may be deposited by a CVD process, or the like. The semiconductor layer 810, the dielectric layer 820, and the dielectric layer 830, can protect the epitaxial layer 700 and the semiconductor layer 410 during subsequent etch processes.

Figure 16:
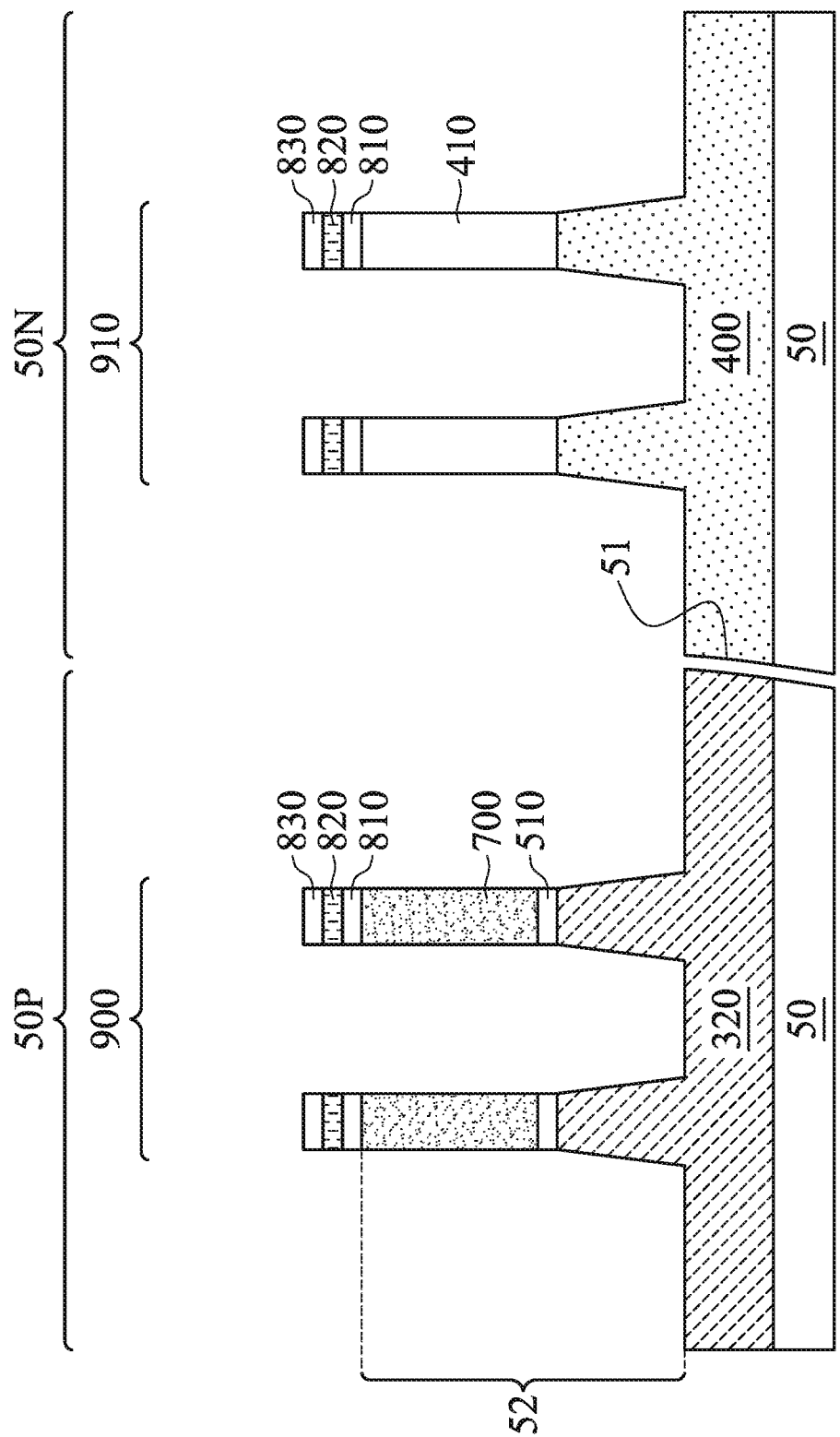

FIG. 16 illustrates portions of the stack 800 (as shown in FIG. 15) being etched to form fins 52, which can include a bottom section made of the n-type region 320, a middle section made of the semiconductor region 510, and top section made of the seed layer 460 and the epitaxial layer 700, according to some embodiments. In some embodiments, fins 52 can also be formed to include a bottom section made of p-type region 400 and a top section made of the semiconductor layer 410. FIG. 16 also illustrates a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over dielectric layer 830 and patterned using a photolithography process. Spacers are formed alongside the patterned sacrificial layer using a self-aligned process. The sacrificial layer is then removed, and the remaining spacers may then be used to pattern the fins.

According to some embodiments, a fin structure 900 can include a bottom section of the n-type region 320, a middle section of the semiconductor region 510, and a top section of the seed layer 460 and epitaxial layer 700. A fin structure 910 can include a bottom section made of the p-type region 400 and a top section made of semiconductor layer 410. The number of fins 52 in the fin structure 900 and the fin structure 910 are exemplary and not limiting. Therefore, fewer or additional fins may be possible depending on the fin pitch and the desired width of each fin.

Figure 17:
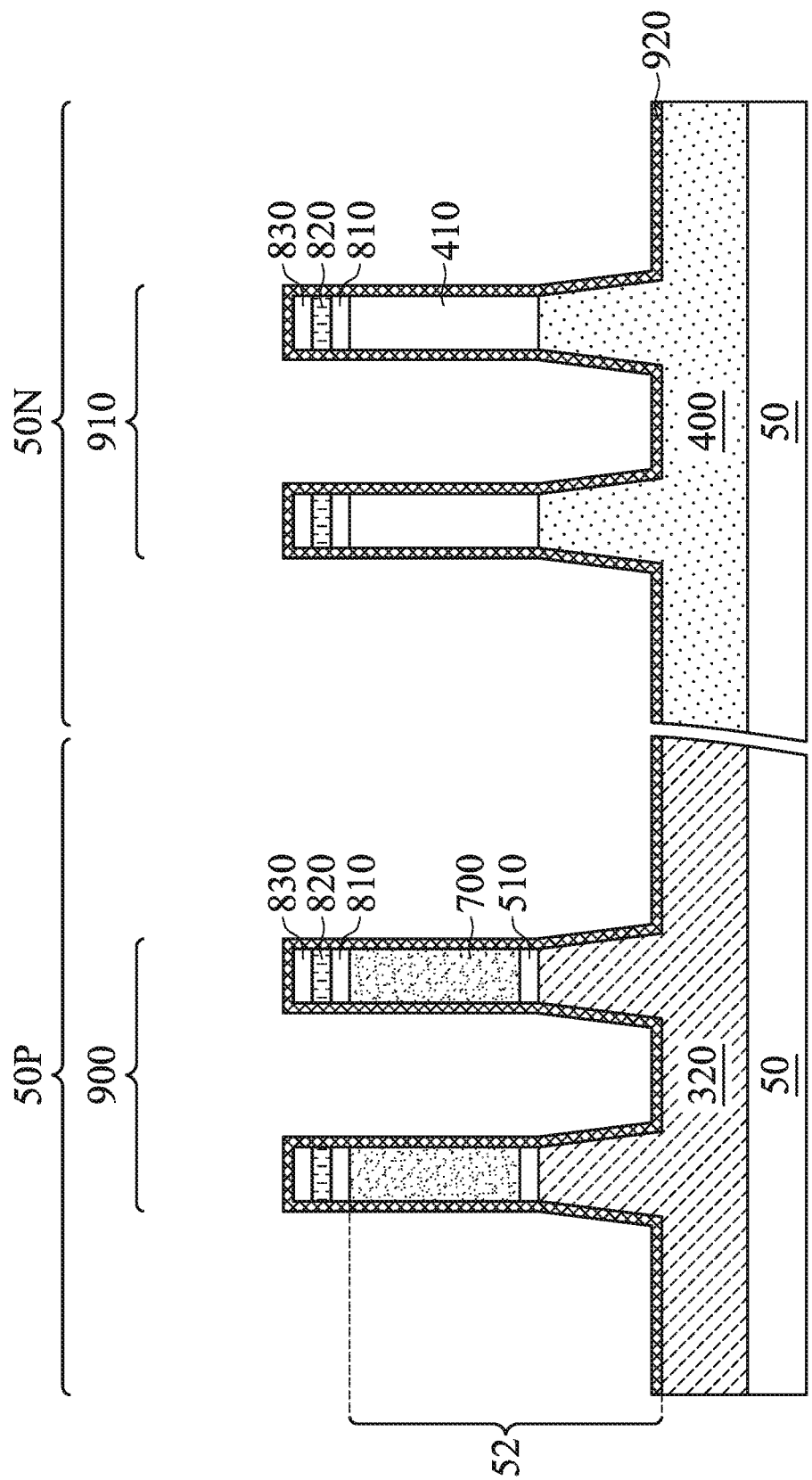

FIG. 17 illustrates the deposition of a dielectric liner 920 over the fin structure 900 and the fin structure 910 to cover the sidewall surfaces of the fin structure 900, the fin structure 910, and horizontal surfaces of p-/n-type regions 400 and 320. The dielectric liner 920 can be, for example, silicon nitride, or the like. The dielectric liner can be formed by a CVD process, or the like. In some embodiments, the dielectric liner 920 can provide structural support to the fin structure 900 and the fin structure 910 during subsequent processing.

Figure 18:
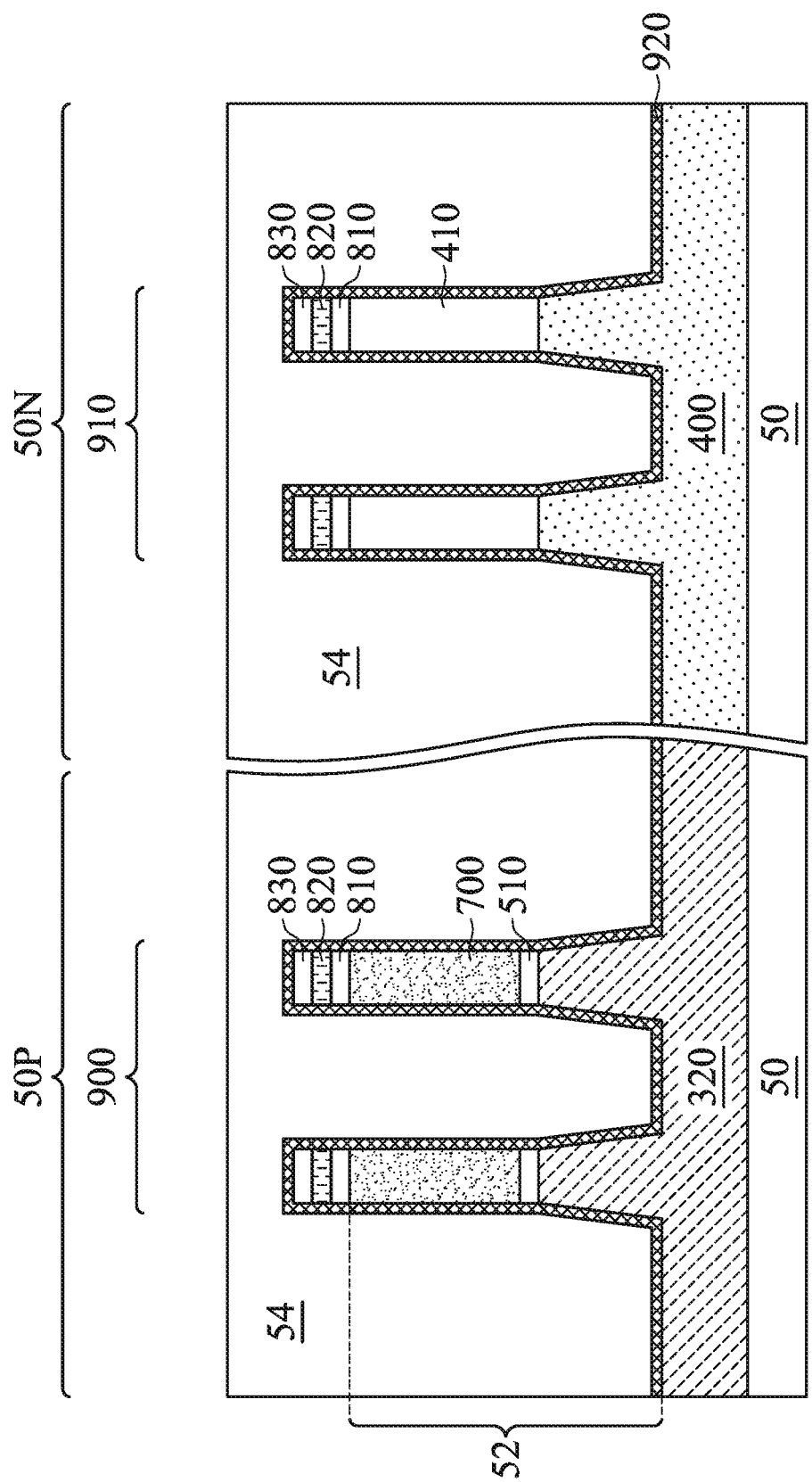

FIG. 18 illustrates an insulation material 54 being formed over the fin structure 900 and the fin structure 910 to fill the space between the fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52, the semiconductor layer 810, the dielectric layer 820, and the dielectric layer 830. Although the insulation material 54 is illustrated as a single layer, some embodiments may utilize multiple layers. For example, in some embodiments a liner (not shown) may first be formed along a surface of the p-/n-type regions 400 and 320 and the fins 52. Thereafter, a fill material, such as those discussed above may be formed over the liner.

Figure 19:
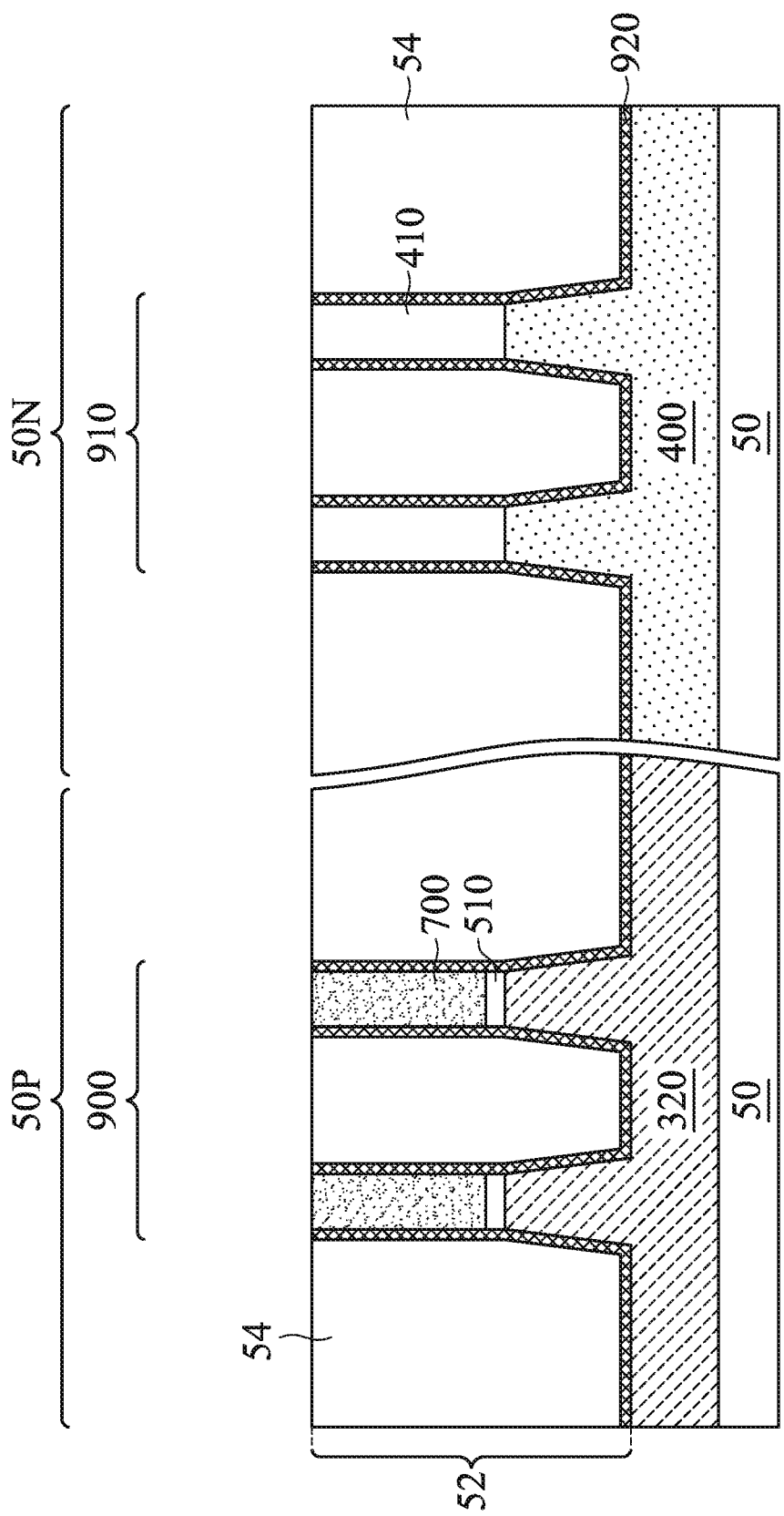

FIG. 19 illustrates a CMP process to remove a portion of insulation material 54 over the fin structure 900 and the fin structure 910. In addition, the semiconductor layer 810, the dielectric layer 820, and the dielectric layer 830 may also be removed. In some embodiments, the CMP process can stop on the dielectric liner 920. In addition, the dielectric liner 920 can also be recessed to the level of insulation material 54.

Figure 20:
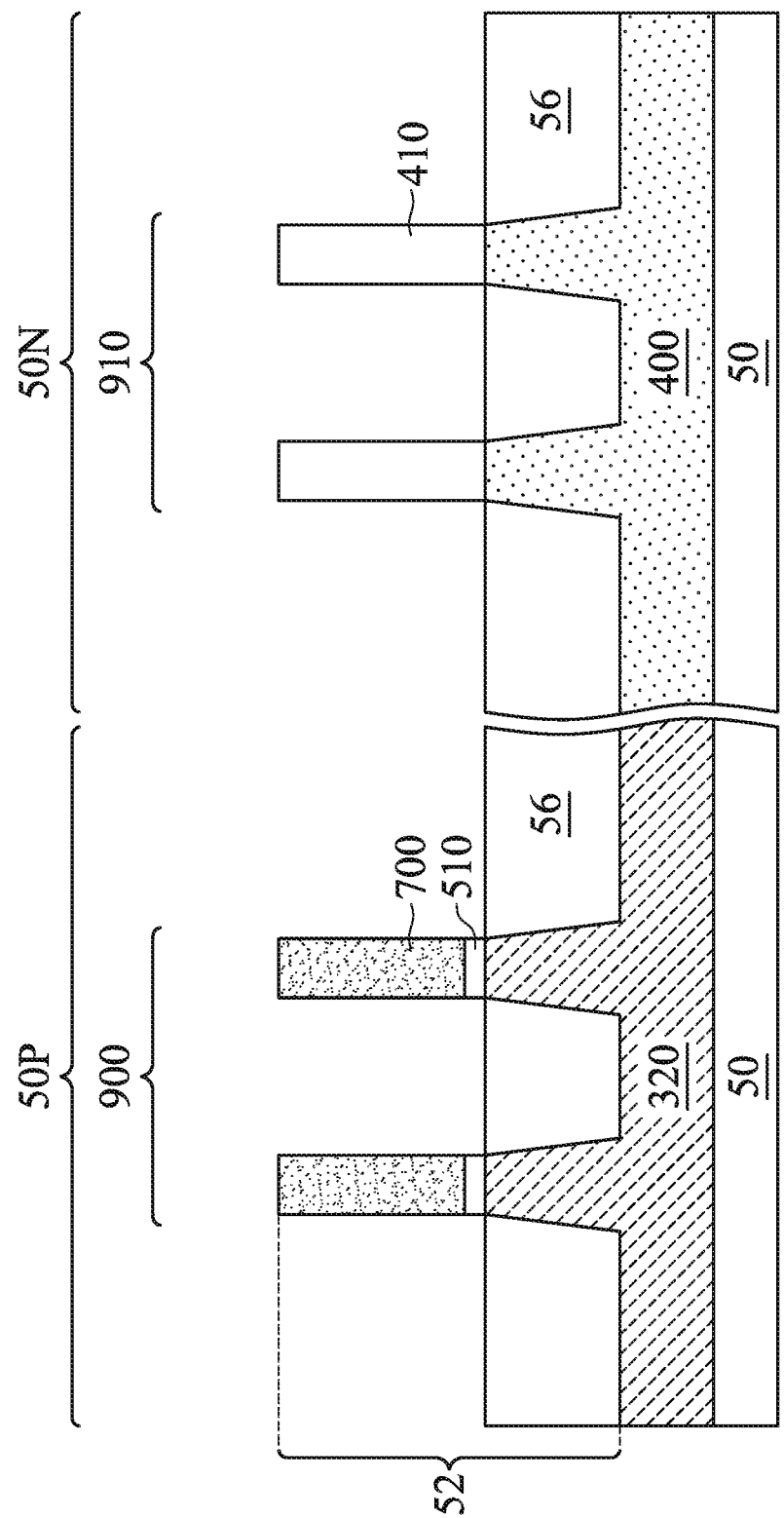

FIG. 20 illustrates subsequent etchback processes that recess insulation material 54 at the level of n- and p-type regions 320 and 400. The insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

In alternate embodiments, a fully strained channel in an n-type Fin Field-Effect Transistor (NFET) can be fabricated in region 50N over p-type region 400. For example, this can be accomplished by forming fins 52 in the fin structure 910 that comprise an epitaxial layer of carbon doped silicon (Si:C) that is grown on a silicon seed layer.

Further in FIG. 20, appropriate wells (not shown) may be formed in the fins 52. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 21:
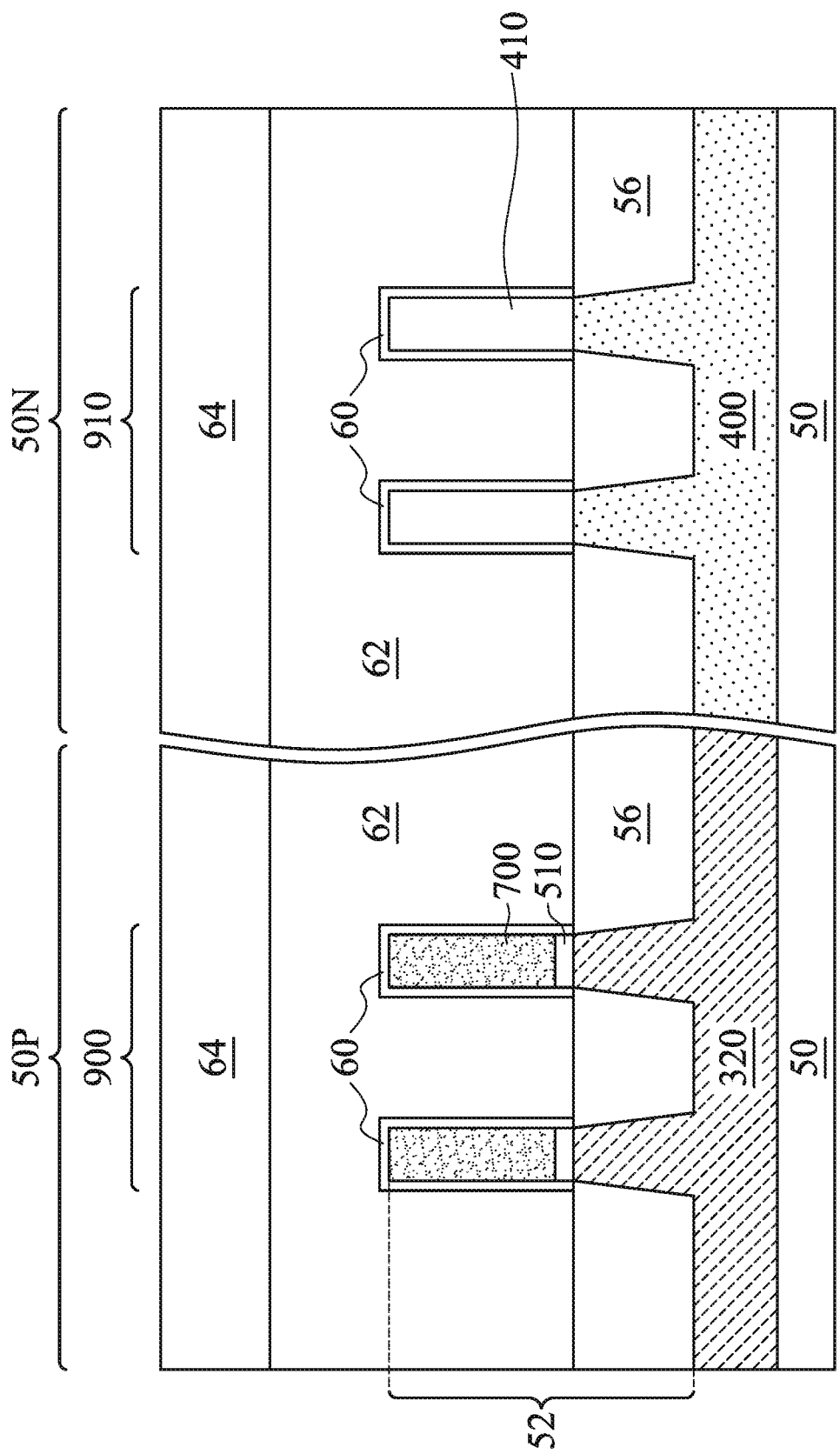

In FIG. 21, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

Figure 22B:
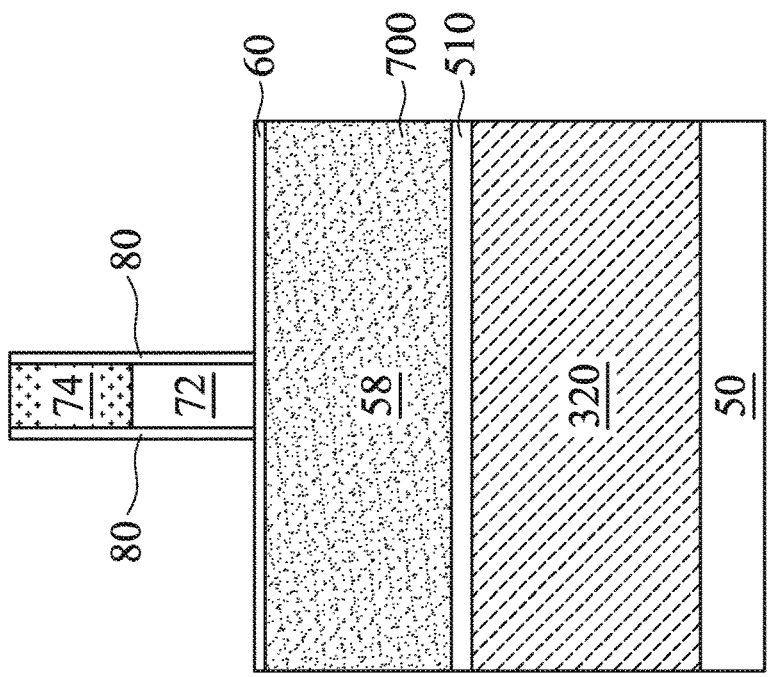
Figure 22A:
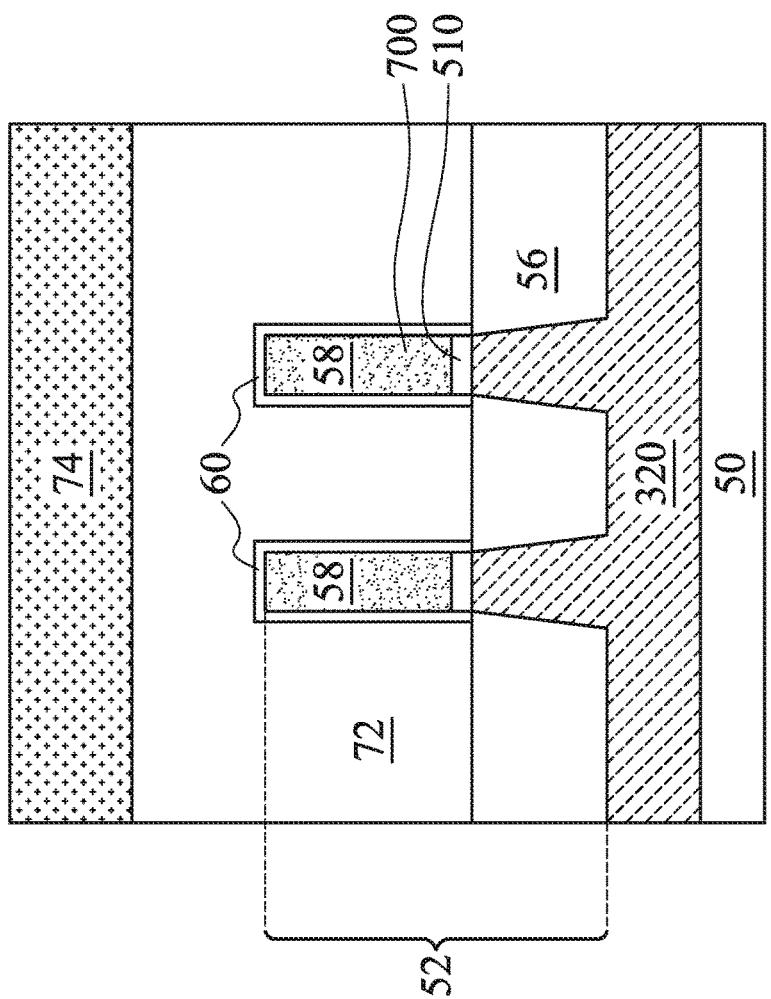

FIGS. 22A through 41B illustrate various additional steps in the manufacturing of embodiment devices. FIGS. 22A and 22B illustrate features in region 50P, and FIGS. 23A and 23B illustrate features in region 50N. In FIGS. 22A through 23B, mask layer 64 may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 22A through 23B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 20, a mask, such as a photoresist, may be formed over the region 50N, while exposing the region 50P, and appropriate type (e.g., n-type or p-type) impurities may be implanted into the exposed fins 52 in the region 50P. The mask may then be removed. Subsequently, a mask, such as a photoresist, may be formed over the region 50P while exposing the region 50N, and appropriate type impurities may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 24B:
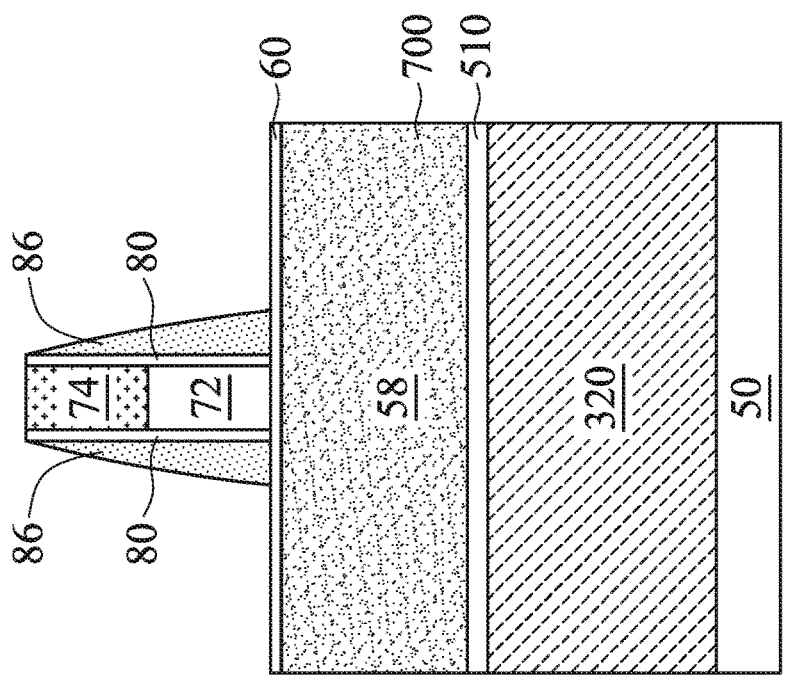
Figure 24A:
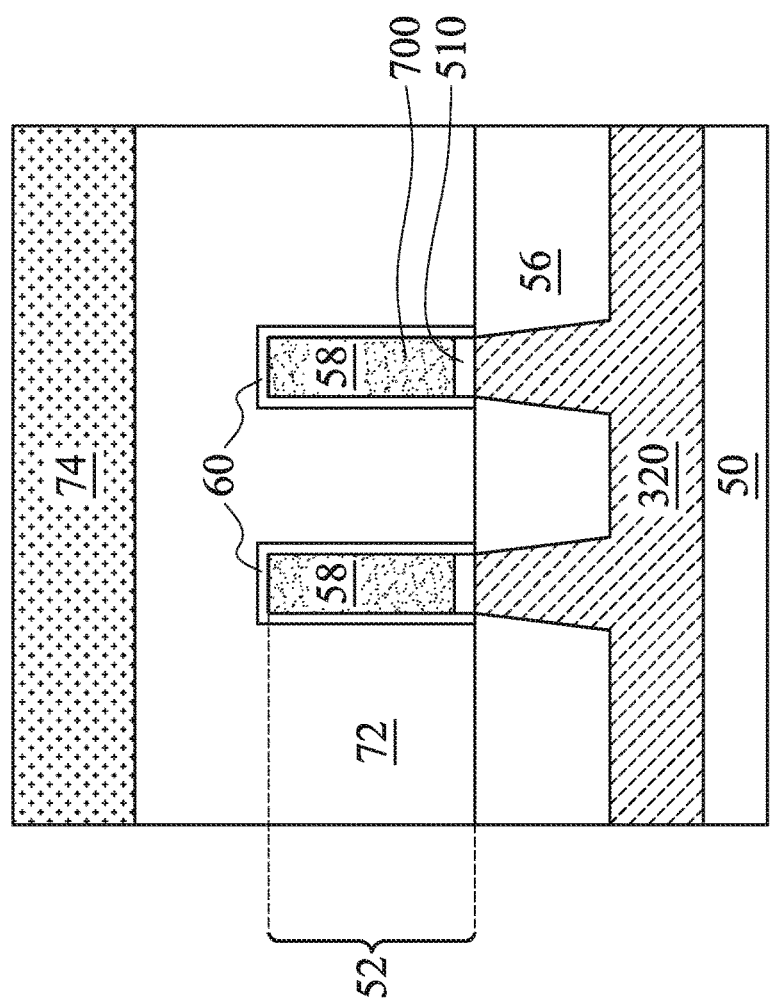
Figure 25B:
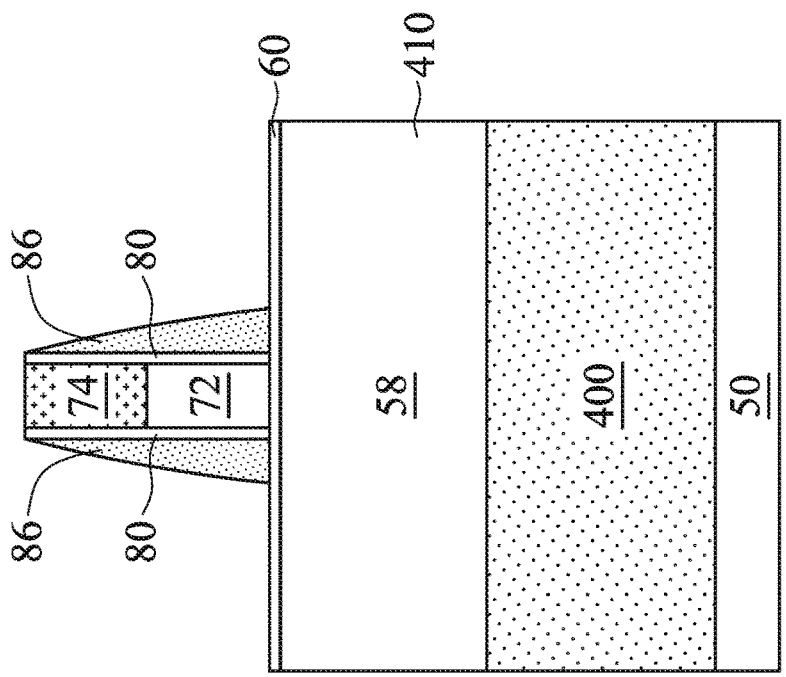
Figure 25A:
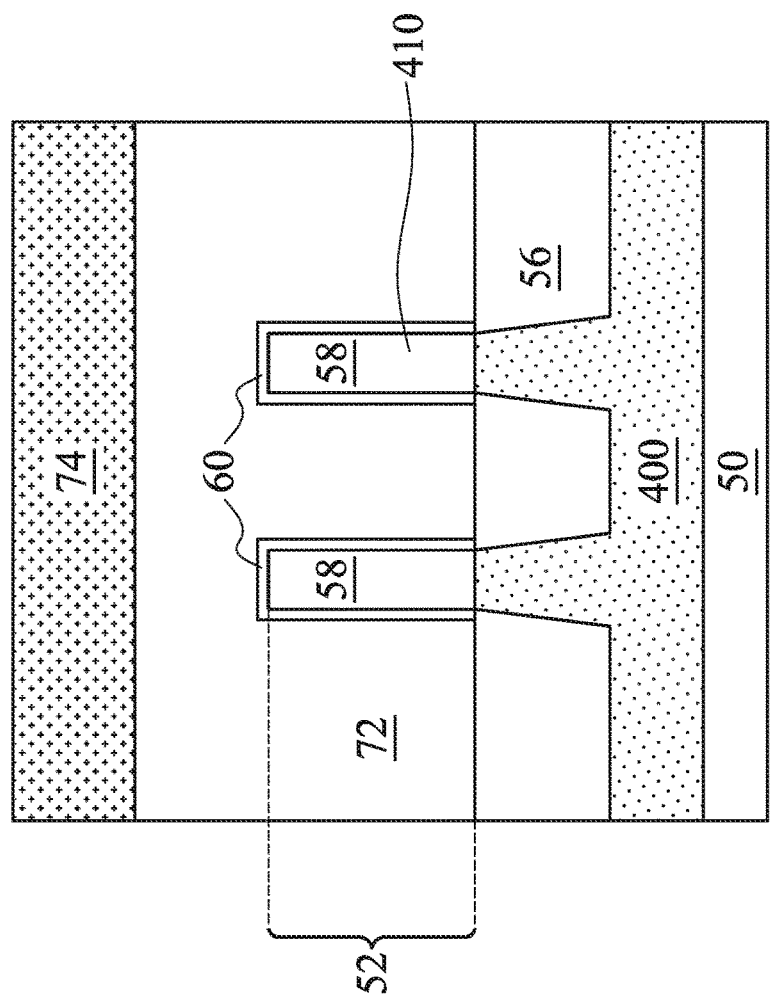

FIGS. 24A and 24B illustrate features in region 50P, and FIGS. 25A and 25B illustrate features in region 50N. In FIGS. 24A through 25B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 26B:
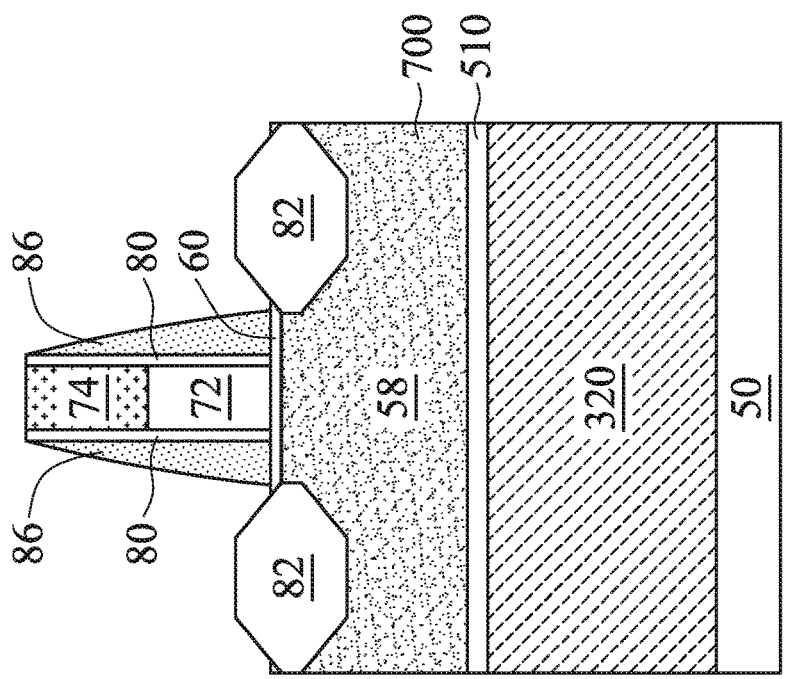
Figure 26A:
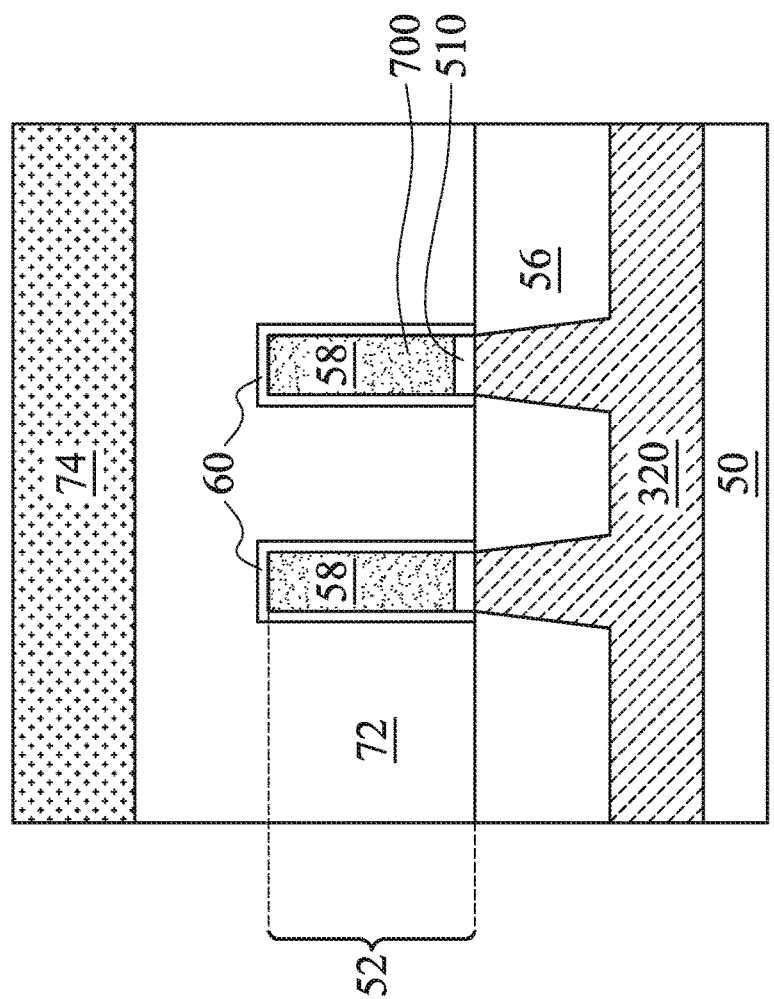
Figure 27B:
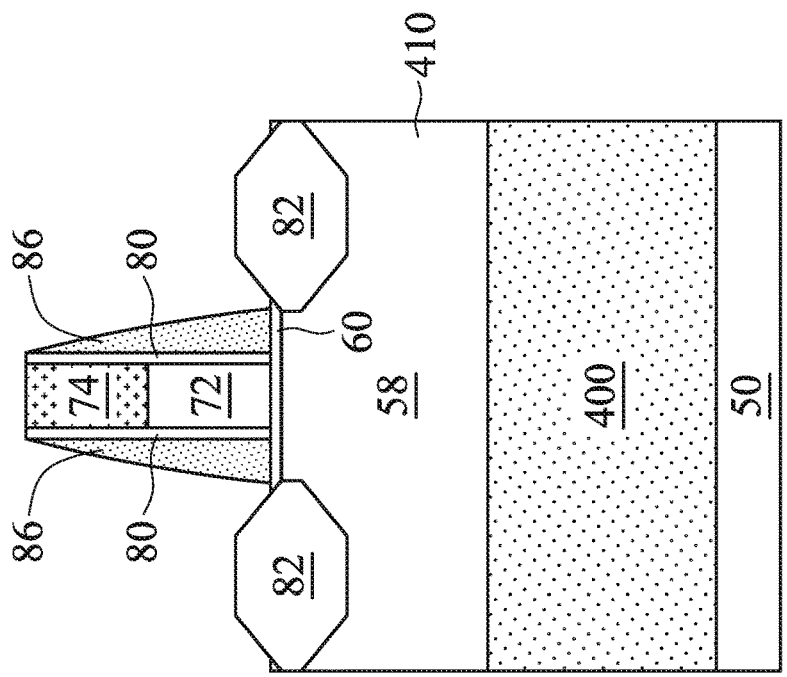
Figure 27A:
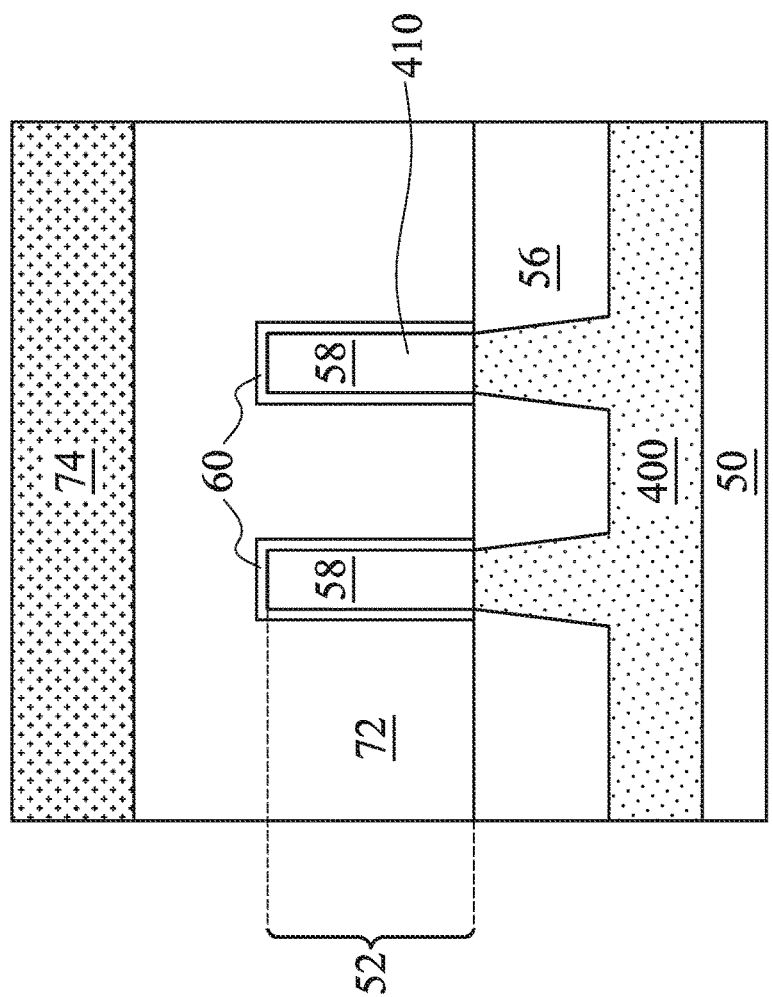

FIGS. 26A and 26B illustrate features in region 50P, and FIGS. 27A and 27B illustrate features in region 50N. In FIGS. 26A through 27B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, the epitaxial source/drain regions 82 in the region 50P may comprise materials such as SiGe, SiB, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 28B:
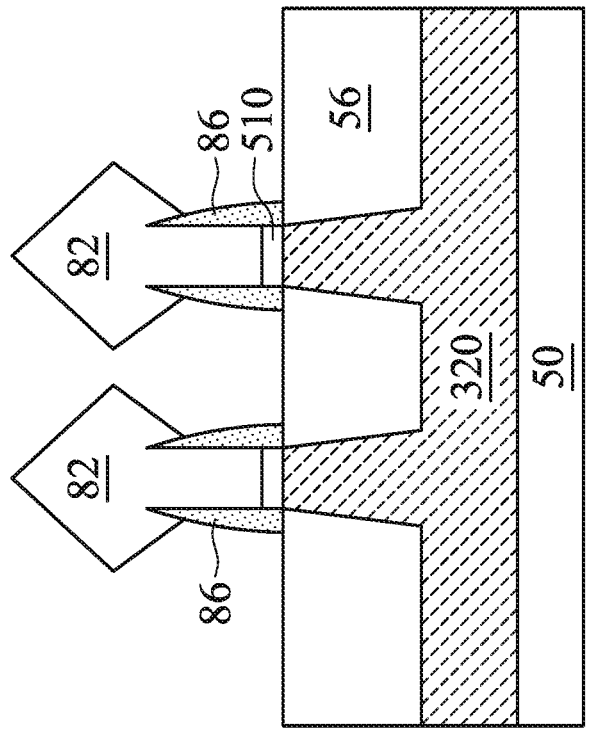
Figure 28A:
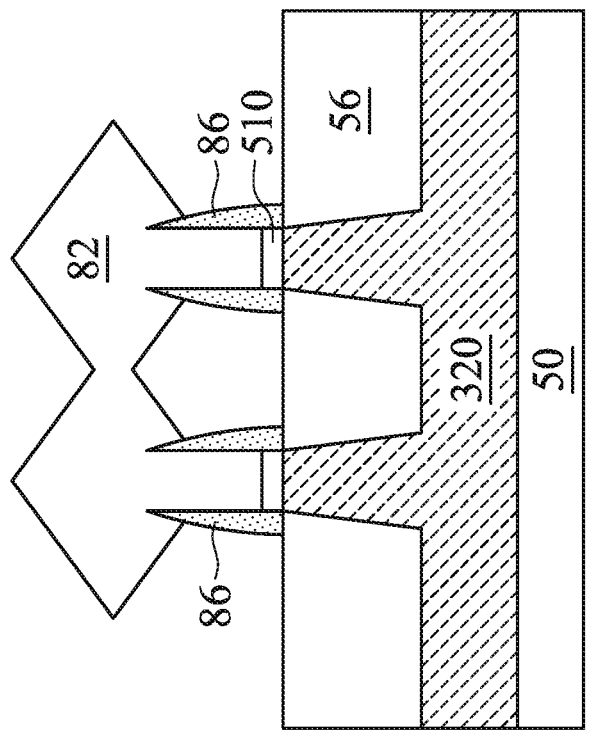
Figure 29A:
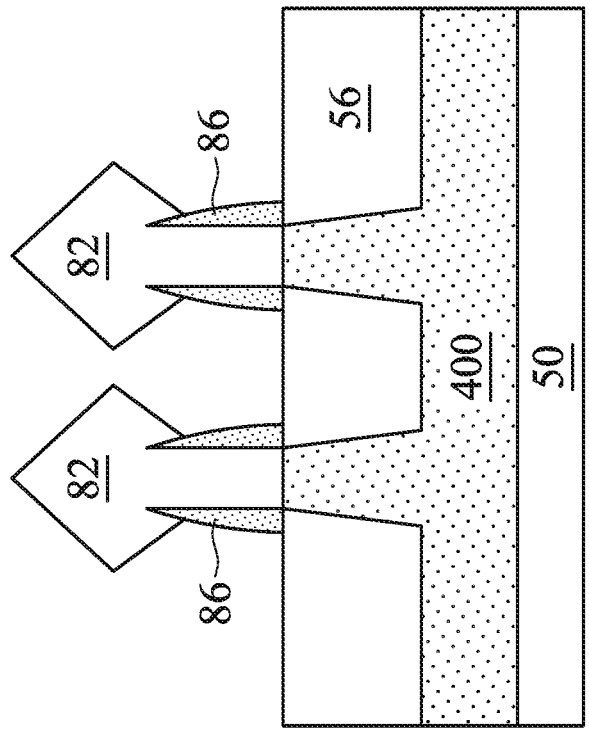
Figure 29B:
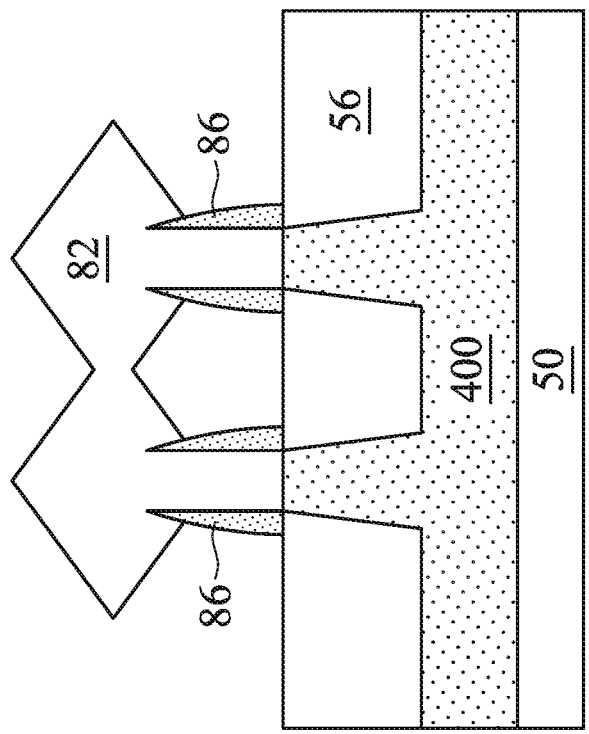

As a result of the epitaxy processes used to form the epitaxial source/drain regions 82 in the region 50P and the region 50N, upper surfaces of the epitaxial source/drain regions have facets which expand laterally outward beyond a sidewalls of the fins 52. In some embodiments, these facets cause adjacent source/drain regions 82 of a same finFET to merge as illustrated by FIGS. 28A and 29A. In other embodiments, adjacent source/drain regions 82 remain separated after the epitaxy process is completed as illustrated by FIGS. 28B and 29B.

Figure 30A:
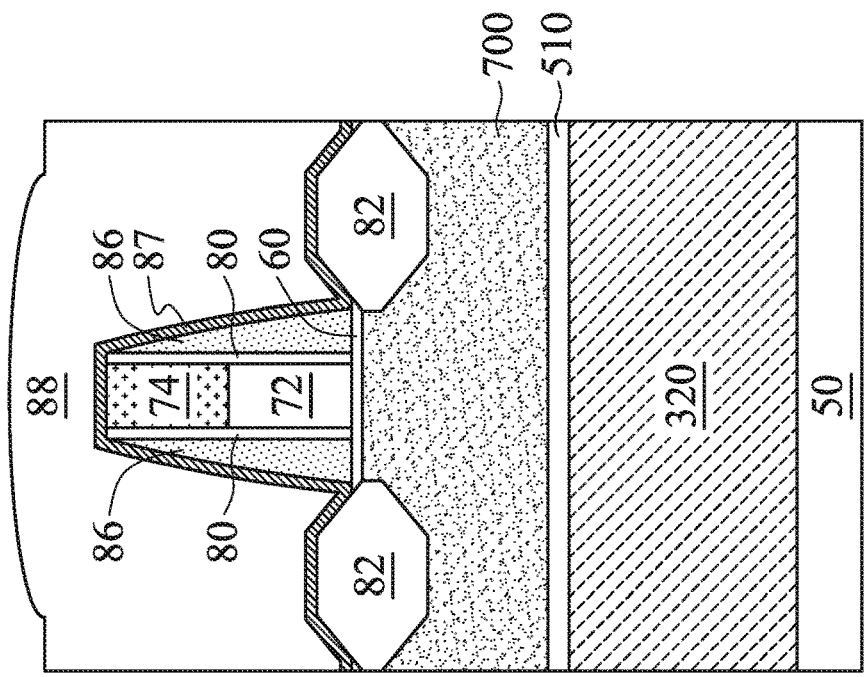
Figure 30B:
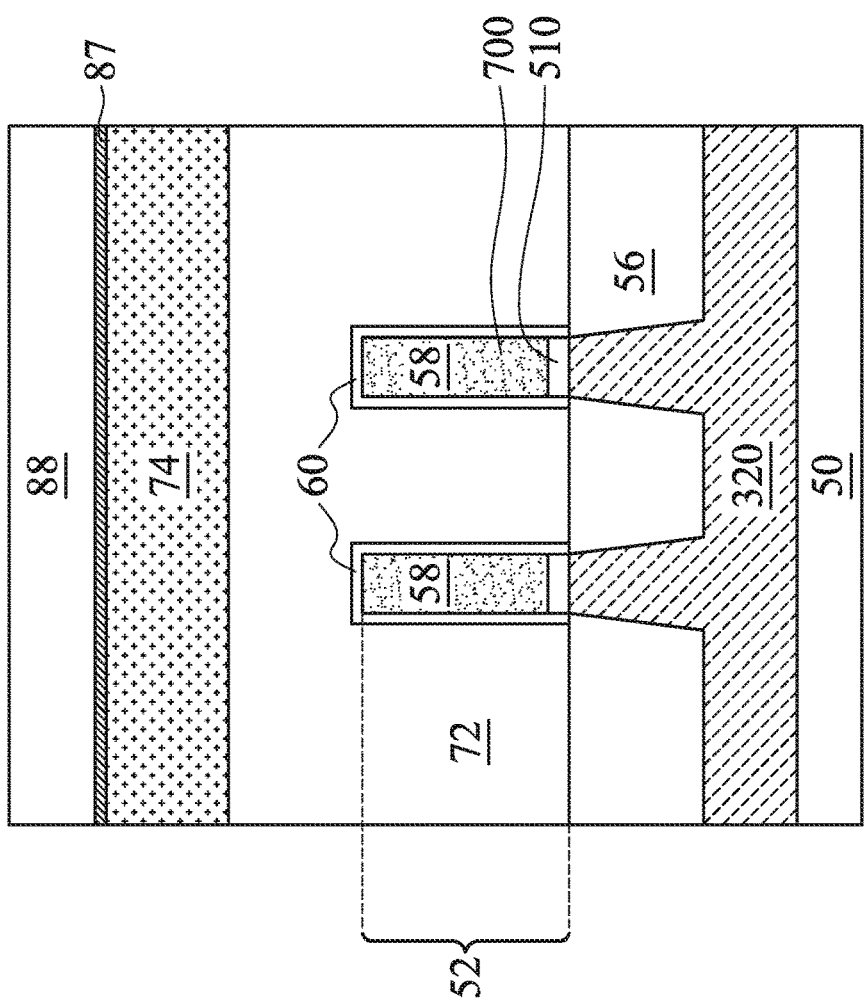
Figure 31B:
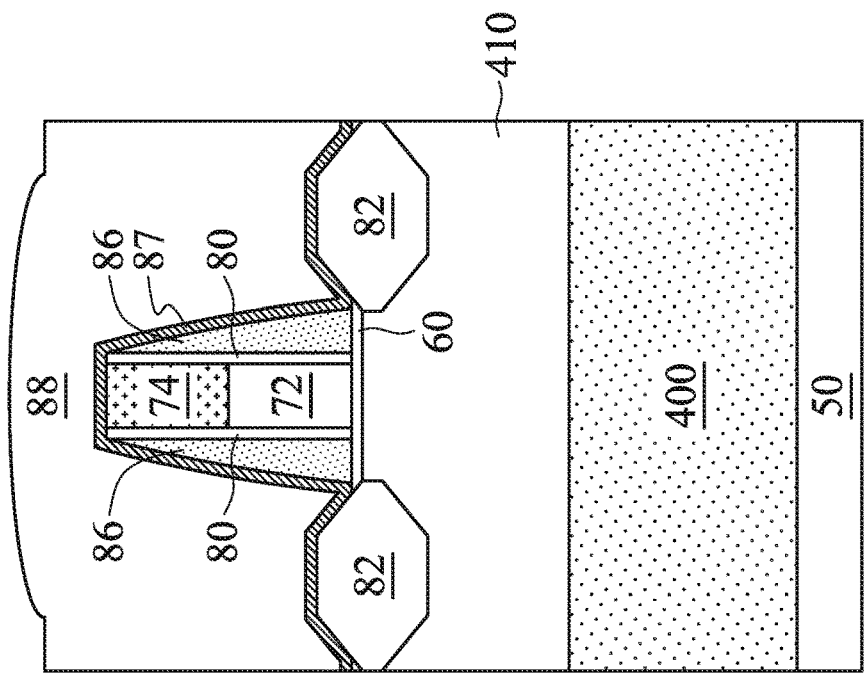
Figure 31A:
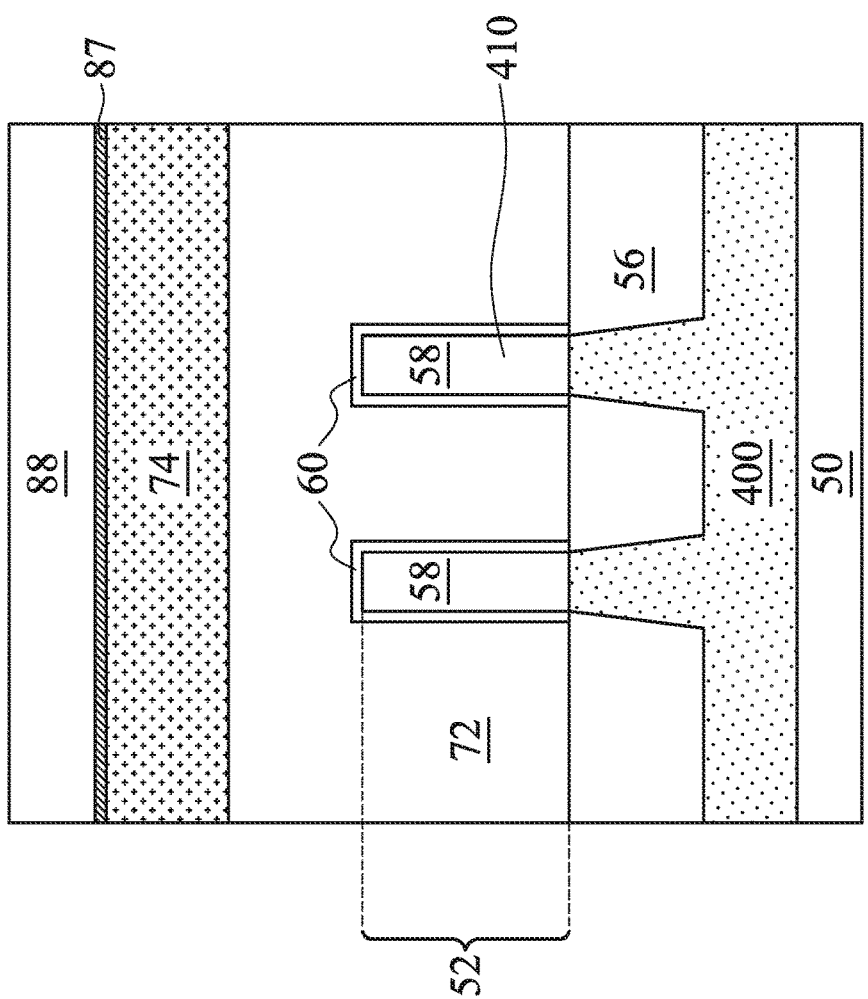

FIGS. 30A and 30B illustrate features in region 50P, and FIGS. 31A and 31B illustrate features in region 50N. In FIGS. 30A through 31B, a first ILD 88 is deposited over the structures illustrated in FIGS. 26A through 27B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 87 is disposed between the first ILD 88 and the epitaxial source/drain regions 82, the hard mask 74, and the gate spacers 86. The CESL 87 may comprise a dielectric material, such as, silicon nitride, silicon oxide, silicon ox nitride, or the like, having a different etch rate than the material of the overlying first ILD 88.

Figure 32B:
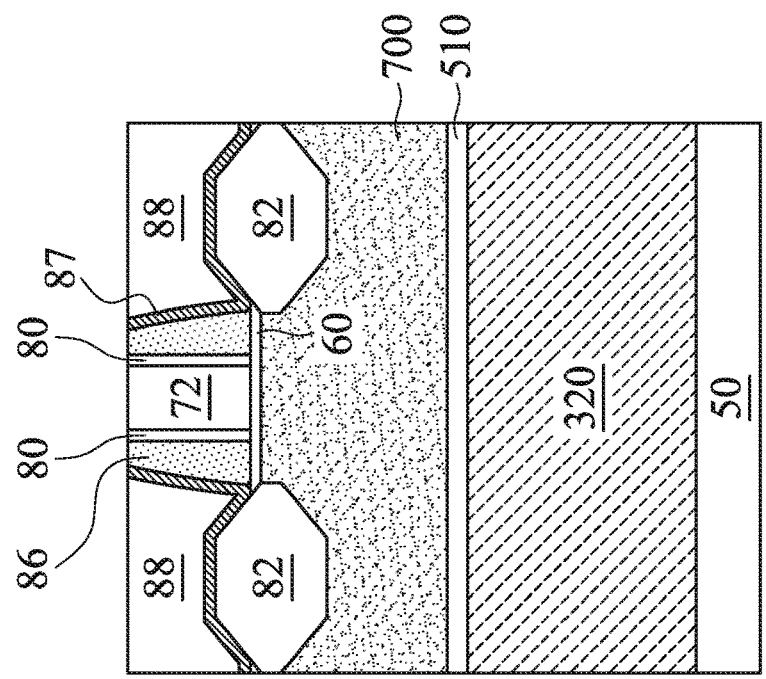
Figure 32A:
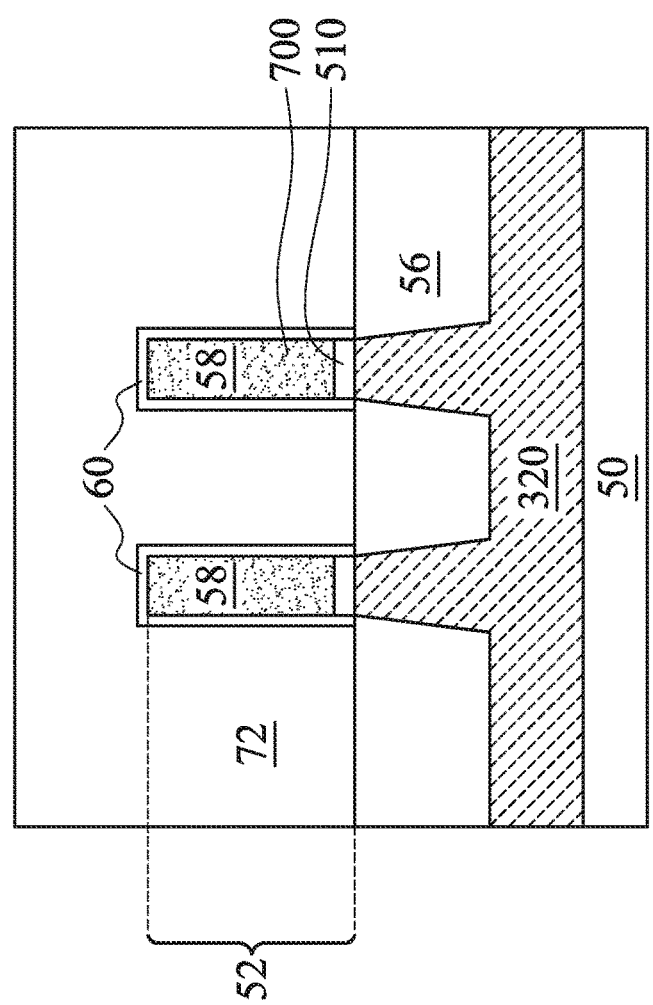

FIGS. 32A and 32B illustrate features in region 50P, and FIGS. 33A and 33B illustrate features in region 50N. In FIGS. 32A through 33B, a planarization process, such as a CMP, may be performed to level the top surface of the first ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88.

Figure 34B:
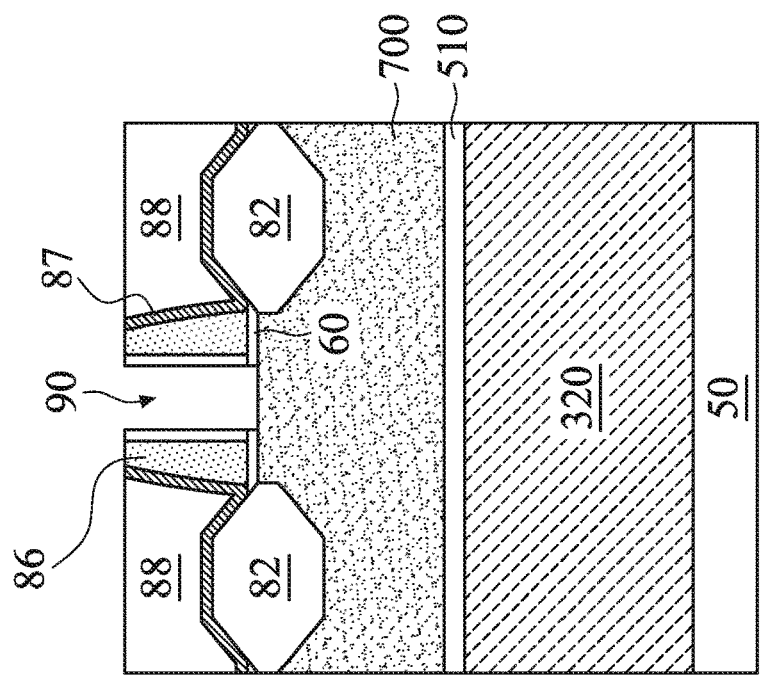
Figure 34A:
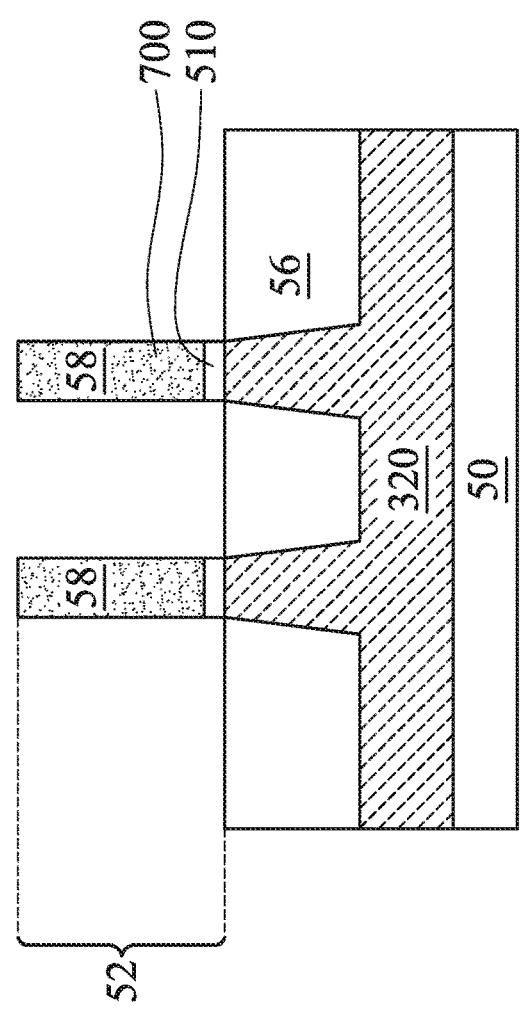
Figure 35B:
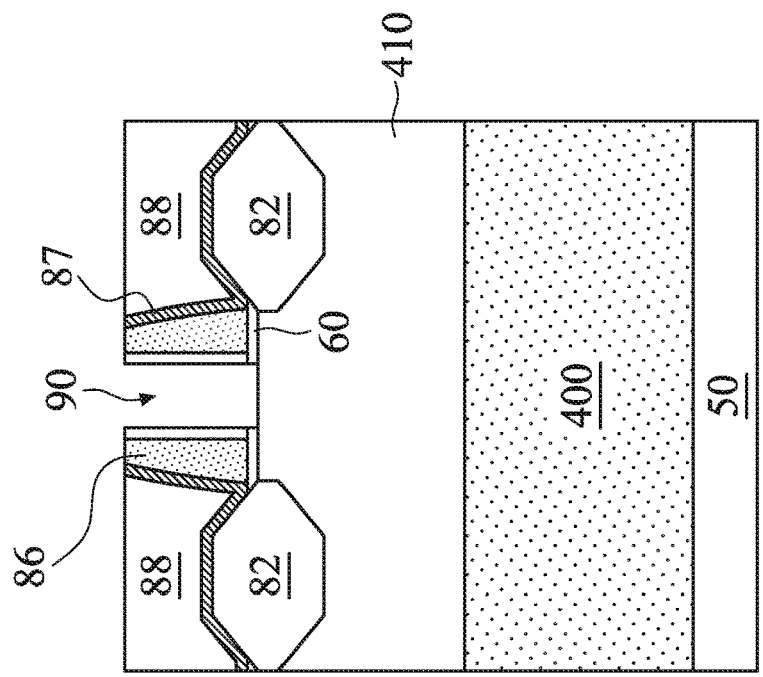
Figure 35A:
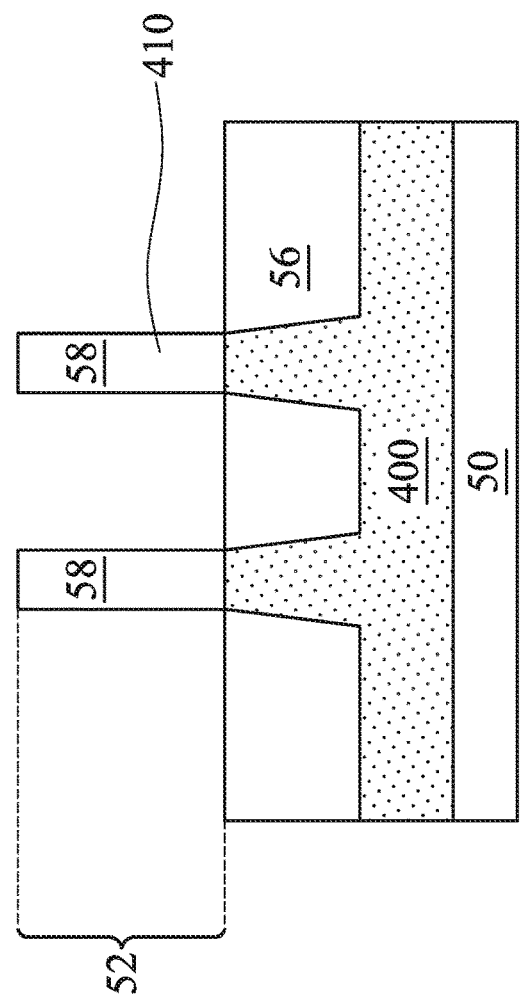

FIGS. 34A and 34B illustrate features in region 50P, and FIGS. 35A and 35B illustrate features in region 50N. In FIGS. 34A through 35B, the dummy gates 72 are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 37B:
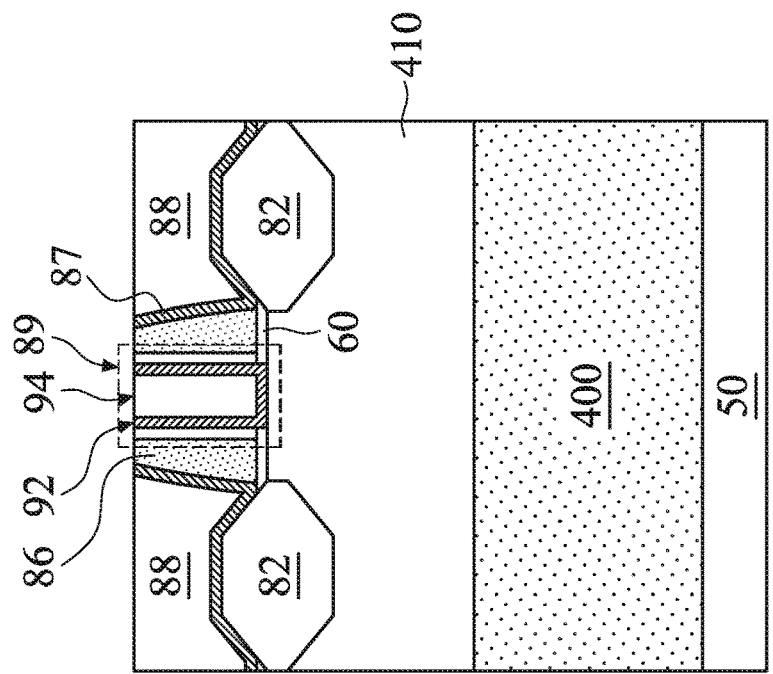
Figure 37A:
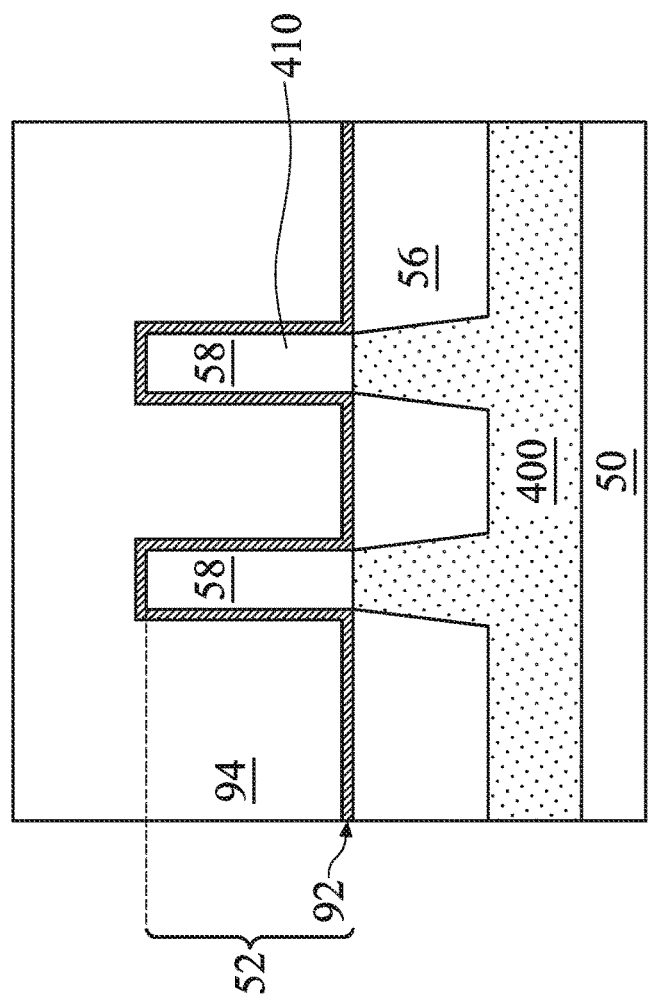
Figure 37C:
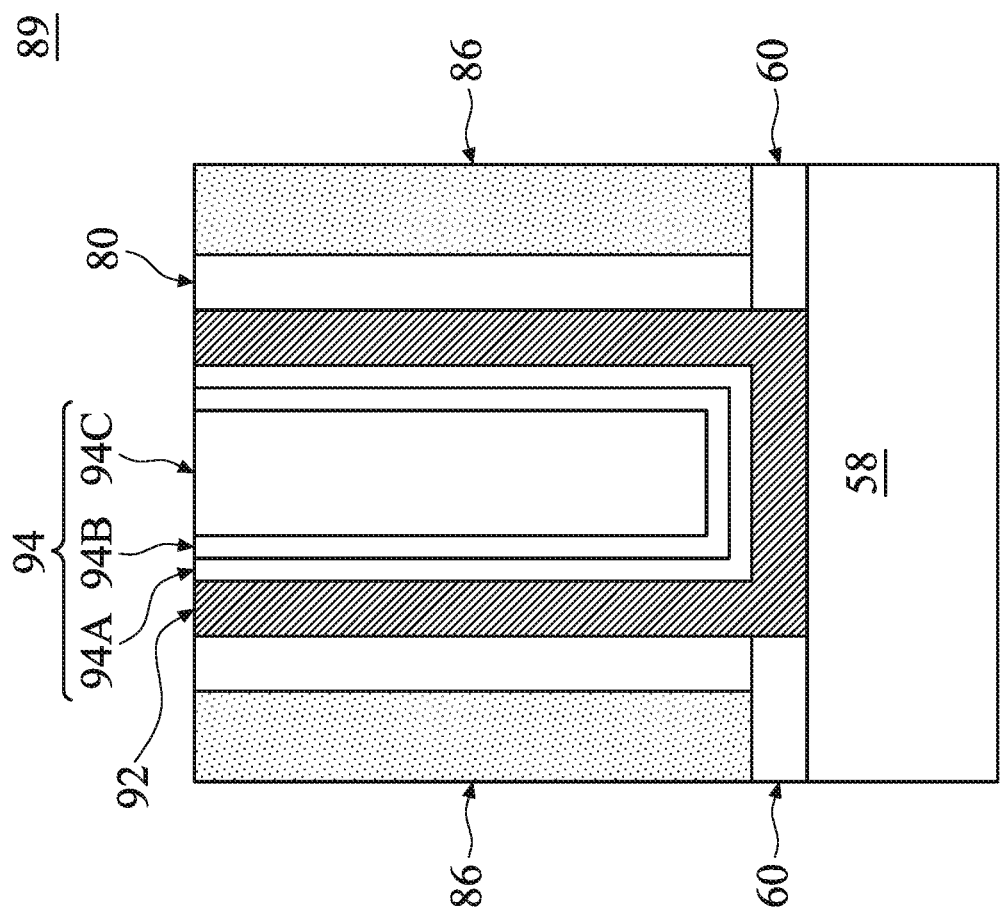

FIGS. 36A and 36B illustrate features in region 50P, and FIGS. 37A and 37B illustrate features in region 50N. In FIGS. 36A through 37B, gate dielectric layers 92 and gate electrodes 94 are formed for replacement gates. FIG. 37C illustrates a detailed view of region 89 of FIGS. 36B and 37B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., SiO).

The gate electrodes 94 are deposited over the gate dielectric layers 92, respectively, and fill the remaining portions of the recesses 90. The gate electrodes 94 may be a metal-containing material such as TiN, TiO, TaN, TaC, Co, Ru, Al, W, combinations thereof, or multi-layers thereof. For example, although a single layer gate electrode 94 is illustrated in FIGS. 36B and 37B, the gate electrode 94 may comprise any number of liner layers 94A, any number of work function tuning layers 94B, and a fill material 94C as illustrated by FIG. 37C. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

FIGS. 38A and 38B illustrate features in region 50P, and FIGS. 39A and 39B illustrate features in region 50N. In FIGS. 38A through 39B, a second ILD 108 is deposited over the first ILD 88. In an embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD.

FIGS. 40A and 40B illustrate features in region 50P, and FIGS. 41A and 41B illustrate features in region 50N. In FIGS. 40A through 41B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The embodiments of the present disclosure have some advantageous features. Using cleaning process steps, followed by a high temperature epitaxy process in the forming of a fully strained channel in a PFET may result in the ability to reduce damage on the surfaces of an etched recess in a semiconductor fin, as well as a reduction in impurities. As a result, the number of dislocation defects in the epitaxial layers formed in the etched recess can be reduced. A first embodiment of the present disclosure may allow for the formation of a fully strained channel in a PFET that has a dislocation defect density lower than $10^3$ cm$^{-2}$, while a second embodiment of the present disclosure may allow for the formation of a fully strained channel in a PFET that has a dislocation defect density lower than 50 cm$^{-2}$. In addition, device leakage is reduced device reliability can be improved and the risk of performance degradation is lowered.

In accordance with an embodiment, a method of forming a semiconductor device includes forming a doped region on a top portion of a substrate; forming a first epitaxial layer over the substrate; forming a recess in the first epitaxial layer, the recess being aligned to the doped region; performing a surface clean treatment in the recess, the surface clean treatment includes oxidizing surfaces of the recess to form an oxide layer in the recess; and removing the oxide layer from the surfaces of the recess; and forming a second epitaxial layer in the recess. In an embodiment, forming the recess includes etching the first epitaxial layer. In an embodiment, performing the surface clean treatment further includes exposing surfaces of the recess to a plasma; and removing contaminants from the surfaces of the recess. In an embodiment, exposing surfaces of the recess to the plasma reduces a surface roughness of the surfaces of the recess. In an embodiment, removing contaminants from the surfaces of the recess includes a wet process that exposes the surfaces of the recess to sulfuric acid ($H_2SO_4$), hydrogen peroxide ($H_2O_2$), ammonium hydroxide ($NH_4OH$), or combinations thereof. In an embodiment, oxidizing surfaces of the recess includes exposing the surfaces of the recess to a process gas including ozone ($O_3$). In an embodiment, removing the oxide layer includes a wet etching process using dilute hydrofluoric acid (dHF). In an embodiment, the first epitaxial layer includes a first material and the second epitaxial layer includes a second material, where the first material has a different lattice constant than the second material.

In accordance with yet another embodiment, a method of forming a semiconductor device includes forming a first doped region and a second doped region in a top portion of a substrate; growing a first epitaxial layer over the first doped region and the second doped region; etching the first epitaxial layer to form a recess, where the recess is aligned to the first doped region; performing a surface clean treatment in the recess, the surface clean treatment includes smoothening surfaces of the recess; removing particles from the surfaces of the recess using a wet clean process; and removing portions of the first epitaxial layer from the recess, where removing the portions of first epitaxial layer from the recess includes forming an oxide layer in the portions of the first epitaxial layer in the recess; and etching the oxide layer; depositing a seed layer in the recess; and growing a second epitaxial layer in the recess and over the seed layer. In an embodiment, the first doped region and the second doped region are oppositely doped. In an embodiment, smoothening surfaces of the recess includes performing a plasma ashing process on the surfaces of the recess. In an embodiment, the plasma ashing process uses chlorine plasma. In an embodiment, the method further includes forming a first fin, where the first fin includes a first portion of the first doped region, a second portion of the first epitaxial layer, and a third portion of the second epitaxial layer; and forming a second fin, where the second fin includes a fourth portion of the second doped region and a fifth portion of the first epitaxial layer. In an embodiment, forming the seed layer includes a deposition temperature in a range of 600° C. to 750° C. In an embodiment, growing the second epitaxial layer includes a growth temperature in a range of 550° C. to 700° C. In an embodiment, a deposition temperature of the seed layer is higher than a growth temperature of the second epitaxial layer.

In accordance with yet another embodiment, a method of forming a semiconductor device includes etching a first semiconductor layer to form a recess, where the etching damages portions of the first semiconductor layer, the recess exposes the damaged portions of the first semiconductor layer; performing a surface clean treatment in the recess, the surface clean treatment includes exposing surfaces of the recess to a plasma, where the plasma includes chlorine gas; forming an oxide layer in the damaged portions of the first semiconductor layer; and removing the oxide layer; forming a seed layer in the recess; and forming a second semiconductor layer in the recess. In an embodiment, the method further includes forming an n-type doped region in a substrate; and depositing the first semiconductor layer over the n-type doped region. In an embodiment, the seed layer includes silicon, carbon doped silicon, silicon germanium, or a combination thereof. In an embodiment, forming an oxide layer includes a dry process that exposes the surfaces of the recess to a process gas that includes ozone ($O_3$), and removing the oxide layer includes a wet process that etches the oxide layer using dilute hydrofluoric acid (dHF).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a doped region on a top portion of a substrate;
    forming a first epitaxial layer over the substrate;
    forming a recess in the first epitaxial layer, the recess being aligned to the doped region;
    performing a surface clean treatment in the recess, the surface clean treatment comprises:
        performing a plasma ashing process in the recess, wherein the plasma ashing process comprises exposing surfaces of the recess to a plasma that includes chlorine gas;
        oxidizing the surfaces of the recess to form an oxide layer in the recess; and
        removing the oxide layer from the surfaces of the recess; and
    forming a second epitaxial layer in the recess.

2. The method of claim 1, wherein forming the recess comprises etching the first epitaxial layer.

3. The method of claim 1, wherein performing the surface clean treatment further comprises
    removing contaminants from the surfaces of the recess.

4. The method of claim 1, wherein exposing surfaces of the recess to the plasma reduces a surface roughness of the surfaces of the recess.

5. The method of claim 3, wherein removing contaminants from the surfaces of the recess comprises a wet process that exposes the surfaces of the recess to sulfuric acid ($H_2SO_4$), hydrogen peroxide ($H_2O_2$), ammonium hydroxide ($NH_4OH$), or combinations thereof.

6. The method of claim 1, wherein oxidizing the surfaces of the recess comprises exposing the surfaces of the recess to a process gas comprising ozone ($O_3$).

7. The method of claim 1, wherein removing the oxide layer comprises a wet etching process using dilute hydrofluoric acid (dHF).

8. The method of claim 1, wherein the first epitaxial layer comprises a first material and the second epitaxial layer comprises a second material, wherein the first material has a different lattice constant than the second material.

9. A method of forming a semiconductor device, the method comprising:
    forming a first doped region and a second doped region in a top portion of a substrate;
    growing a first epitaxial layer over the first doped region and the second doped region;
    etching the first epitaxial layer to form a recess, wherein the recess is aligned to the first doped region;
    performing a surface clean treatment in the recess, the surface clean treatment comprises:
        smoothening surfaces of the recess, wherein smoothening surfaces of the recess comprises performing a plasma ashing process on the surfaces of the recess, and wherein the plasma ashing process uses chlorine plasma;
        removing particles from the surfaces of the recess using a wet clean process; and
        removing portions of the first epitaxial layer from the recess, wherein removing the portions of the first epitaxial layer from the recess comprises:
            forming an oxide layer in the portions of the first epitaxial layer in the recess; and
            etching the oxide layer;
    depositing a seed layer in the recess; and
    growing a second epitaxial layer in the recess and over the seed layer.

10. The method of claim 9, wherein the first doped region and the second doped region are oppositely doped.

11. The method of claim 9, further comprising:
    forming a first fin, wherein the first fin comprises a first portion of the first doped region, a second portion of the first epitaxial layer, and a third portion of the second epitaxial layer; and forming a second fin, wherein the second fin comprises a fourth portion of the second doped region and a fifth portion of the first epitaxial layer.

12. The method of claim 9, wherein forming the seed layer comprises a deposition temperature in a range of 600° C. to 750° C.

13. The method of claim 9, wherein growing the second epitaxial layer comprises a growth temperature in a range of 550° C. to 700° C.

14. The method of claim 9, wherein a deposition temperature of the seed layer is higher than a growth temperature of the second epitaxial layer.

15. The method of claim 9, wherein the plasma ashing process is performed at a temperature that is in a range from 20° C. to 90° C.

16. The method of claim 9, wherein etching the oxide layer comprises an etching process that includes dilute hydrofluoric (dHF) acid.

17. A method of forming a semiconductor device, the method comprising:
   etching a first semiconductor layer to form a recess, wherein the etching damages portions of the first semiconductor layer, the recess exposes the damaged portions of the first semiconductor layer;
   performing a surface clean treatment in the recess, the surface clean treatment comprises:
   exposing surfaces of the recess to a plasma, wherein the plasma comprises chlorine gas;
   forming an oxide layer in the damaged portions of the first semiconductor layer; and
   removing the oxide layer;
      forming a seed layer in the recess; and
      forming a second semiconductor layer in the recess.

18. The method of claim 17 further comprising:
   forming an n-type doped region in a substrate; and
   depositing the first semiconductor layer over the n-type doped region.

19. The method of claim 17, wherein the seed layer comprises silicon, carbon doped silicon, silicon germanium, or a combination thereof.

20. The method of claim 17, wherein forming an oxide layer comprises a dry process that exposes the surfaces of the recess to a process gas that comprises ozone (O3), and removing the oxide layer comprises a wet process that etches the oxide layer using dilute hydrofluoric acid (dHF).

* * * * *

UNITED STATES PATENT AND TRADEMARK OFFICE
CERTIFICATE OF CORRECTION

PATENT NO. : 11,316,030 B2
APPLICATION NO. : 17/021640
DATED : April 26, 2022
INVENTOR(S) : Che-Lun Chang et al.

It is certified that error appears in the above-identified patent and that said Letters Patent is hereby corrected as shown below:

In the Claims

Claim 20, Column 20, Line 20; delete "(03)" and insert --($O_3$)--.

Signed and Sealed this
Twenty-eighth Day of June, 2022

Katherine Kelly Vidal
*Director of the United States Patent and Trademark Office*